(12) United States Patent
Polomoff et al.

(10) Patent No.: US 11,215,661 B2
(45) Date of Patent: Jan. 4, 2022

(54) CASCADED SENSING CIRCUITS FOR DETECTING AND MONITORING CRACKS IN AN INTEGRATED CIRCUIT

(71) Applicant: GLOBALFOUNDRIES U.S. INC., Santa Clara, CA (US)

(72) Inventors: Nicholas A. Polomoff, Hopewell Junction, NY (US); Dewei Xu, Clifton Park, NY (US); Eric D. Hunt-Schroeder, Essex Junction, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 80 days.

(21) Appl. No.: 16/872,597

(22) Filed: May 12, 2020

(65) Prior Publication Data
US 2021/0356514 A1    Nov. 18, 2021

(51) Int. Cl.
G01R 31/28    (2006.01)
(52) U.S. Cl.
CPC .................. G01R 31/2853 (2013.01)
(58) Field of Classification Search
CPC ................................................ G01R 31/2853
USPC .................................. 324/762.01, 537, 500
See application file for complete search history.

(56) References Cited

U.S. PATENT DOCUMENTS

| | | | |
|---|---|---|---|
| 6,449,748 B1 | 9/2002 | Jeng et al. | |
| 7,098,676 B2 | 8/2006 | Landers et al. | |
| 7,491,578 B1 | 2/2009 | Shaw et al. | |
| 7,646,078 B2 | 1/2010 | Jeng et al. | |
| 7,741,715 B2 | 6/2010 | Kim et al. | |
| 8,575,723 B2 | 11/2013 | Tschmelitsch et al. | |
| 8,912,076 B2 | 12/2014 | West et al. | |
| 11,105,846 B1 * | 8/2021 | Polomoff | G01R 31/2884 |
| 2002/0024115 A1 | 2/2002 | Ibnabdeljalil et al. | |
| 2010/0109128 A1 | 5/2010 | West et al. | |
| 2011/0068435 A1 | 3/2011 | Hudson | |
| 2012/0032693 A1 | 2/2012 | Xue et al. | |
| 2013/0009663 A1 | 1/2013 | Gauch et al. | |
| 2014/0021469 A1 * | 1/2014 | Cooney, III | H01L 22/34 257/48 |
| 2021/0151387 A1 * | 5/2021 | Huang | H01L 22/34 |

* cited by examiner

Primary Examiner — Giovanni Astacio-Oquendo
(74) Attorney, Agent, or Firm — Hoffman Warnick LLC

(57) ABSTRACT

Embodiments of the disclosure provide a crack detecting and monitoring system, including: a plurality of electrically conductive structures extending about a protective barrier formed in an inactive region of an integrated circuit (IC), wherein an active region of the IC is enclosed within the protective barrier; and a plurality of stages of sensing circuits connected in series for sensing a change in an electrical characteristic of each of the plurality of structures and for receiving an enable signal, wherein each sensing circuit is coupled to a respective structure of the plurality of structures, the change in the electrical characteristic indicating damage to the respective structure, wherein each sensing circuit includes a circuit for selectively generating the enable signal for a next sensing circuit in the plurality of stages of sensing circuits.

18 Claims, 16 Drawing Sheets

CASCADED SENSING CIRCUITS FOR DETECTING AND MONITORING CRACKS IN AN INTEGRATED CIRCUIT

BACKGROUND

The present disclosure relates to integrated circuits, and more specifically, to cascaded sensing circuits for detecting and monitoring cracks in an integrated circuit (IC).

Processes, such as the dicing of wafers, may result in the formation and propagation of cracks in an IC. Such cracks often form at interfaces between dielectric materials and metal lines/contacts in the IC.

ICs are often exposed to harsh, hostile, and stressful environments (e.g., automotive, aerospace, military, etc.). Fluctuations in environmental conditions (e.g., temperature, humidity, and barometric changes) may exacerbate and activate slow crack growth mechanisms upon nascent and dormant cracks (e.g., cracks formed during dicing of a wafer) in the ICs. Continual oscillation of the environmental conditions may enhance the growth of nascent and dormant cracks over time, potentially leading to IC failure.

Crackstops (e.g., an interconnected structure of metal lines and vias) have been fabricated and employed to block cracks from propagating into an active region of an IC. Such crackstops are generally formed around the periphery of the IC and surround the inner core (active area) of the IC.

Although effective, crackstops may not always be able to prevent a crack from propagating into the active region of an IC. To this extent, crack detecting structures, placed in the active region of an IC inside of the crackstop, have been developed to detect the presence of a crack that has propagated past the crackstop into the active region of the IC chip. However, such crack detecting structures are inherently flawed as they are designed to detect a crack after it is too late and the crack has already reached the active region of the IC chip.

SUMMARY

An aspect of the disclosure is directed to a system for detecting and monitoring a crack in an integrated circuit (IC), including: a plurality of electrically conductive structures extending about a protective barrier formed in an inactive region of an integrated circuit (IC), wherein an active region of the IC is enclosed within the protective barrier; and a plurality of stages of sensing circuits connected in series for sensing a change in an electrical characteristic of each of the plurality of structures and for receiving an enable signal, wherein each sensing circuit is coupled to a respective structure of the plurality of structures, the change in the electrical characteristic indicating damage to the respective structure, wherein each sensing circuit incudes a circuit for selectively generating the enable signal for a next sensing circuit in the plurality of stages of sensing circuits.

Another aspect is directed to a method for detecting and monitoring a crack in an integrated circuit (IC), including: providing a plurality of electrically conductive structures in an inactive region of the IC, the plurality of electrically conductive structures extending about a protective barrier formed in the inactive region of the IC, wherein an active region of the IC is enclosed within the protective barrier; coupling a plurality of stages of sensing circuits connected in series to the plurality of electrically conductive structures, wherein each sensing circuit is coupled to a respective structure of the plurality of structures; enabling the sensing circuit in a stage N of the plurality of stages of sensing circuits; monitoring, by the enabled sensing circuit, an electrical characteristic of the respective structure coupled to the enabled sensing circuit; and in response to detecting a change in the electrical characteristic of the respective structure coupled to the enabled sensing circuit, outputting, by the enabled sensing circuit, an enable signal for enabling the sensing circuit in a downstream stage N+1 of the plurality of stages of sensing circuits.

Another aspect is directed to a method, including: coupling a plurality of stages of sensing circuits connected in series to a plurality of electrically conductive structures on an integrated circuit (IC), wherein each sensing circuit is coupled to a respective structure of the plurality of structures; enabling the sensing circuit in a stage N of the plurality of stages of sensing circuits; monitoring, by the enabled sensing circuit, an electrical characteristic of the respective structure coupled to the enabled sensing circuit; and in response to detecting a change in the electrical characteristic of the respective structure coupled to the enabled sensing circuit, outputting, by the enabled sensing circuit, an enable signal for enabling the sensing circuit in a downstream stage N+1 of the plurality of stages of sensing circuits.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements.

Figure 1:
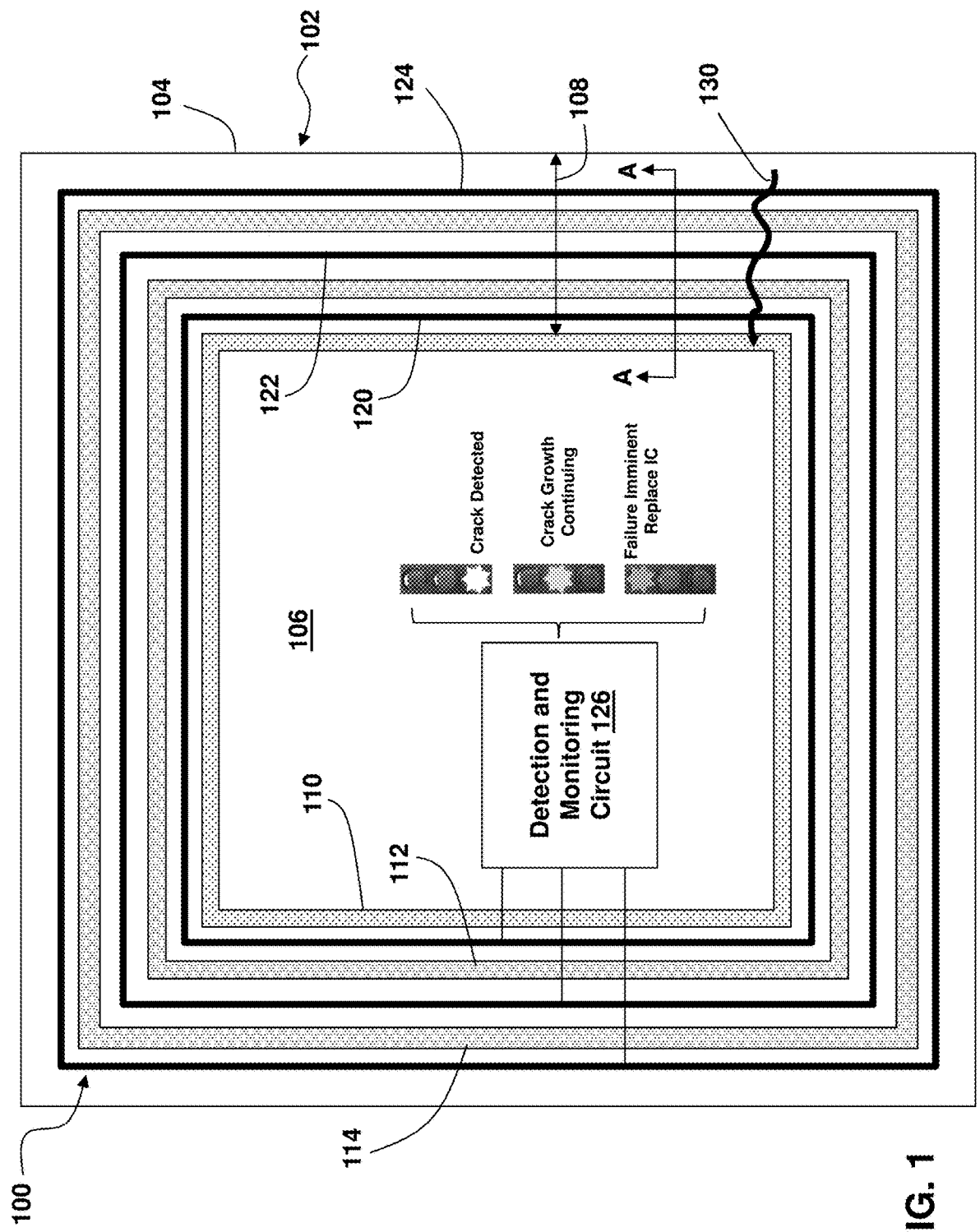
FIG. 1 depicts a plan view of an integrated circuit (IC) including a system for detecting and monitoring the growth of cracks according to embodiments.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

FIG. 1 depicts a plan view of an integrated circuit (IC) 102 including a crack detecting and monitoring system 100 for detecting and monitoring the growth of cracks according to embodiments. The IC 102 is formed on a semiconductor substrate 104 (e.g., a silicon wafer) and includes an inner core (hereafter active region 106) surrounded by and isolated from an inactive region 108 by a guard ring 110 and at least one crackstop 112, 114. The active region 106 typically includes a plurality of active and passive components (e.g., transistors, resistors, etc.). The guard ring 110 and crackstops 112, 114 provide environmental, electrical (e.g., the guard ring provides electrical ground), and/or mechanical protection for the active region 106 of the IC 102. For example, the crackstops 112, 114 may be employed to block cracks from propagating from the inactive region 108 of the IC 102 into the active region 106 of the IC 102. The guard ring 110 and crackstops 112, 114 may be conventional in nature and may be provided using any now known or later developed processes/technologies.

According to embodiments, the crack detecting and monitoring system 100 is configured to detect and monitor the growth of one or more cracks in the inactive region 108 of the IC 102—before any cracks propagate into the active region 106 of the IC 102. In general, as depicted in FIG. 1, the crack detecting and monitoring system 100 may include at least one electrically conductive perimeter line (PLINE) formed in the inactive region 108 of the IC 102. For example, a first PLINE 120, second PLINE 122, and third PLINE 124 may be formed in the inactive region 108 of the IC 102. In this example, as shown in FIG. 1, first PLINE 120 may be formed about an outer periphery of the guard ring 110, between the guard ring 110 and the crackstop 112. Second PLINE 122 may be formed about an outer periphery of the crackstop 112, between the crackstop 112 and the crackstop 114. Third PLINE 124 may be formed about an outer periphery of the crackstop 114. Although three PLINEs 120, 122, 124 are utilized in this embodiment, it should be evident that the crack detecting and monitoring system 100 may include a larger or smaller number of PLINEs (e.g., one or more). In addition, PLINEs may be formed in other locations in the inactive region 108 of the IC 102, and/or a plurality of PLINEs may be formed adjacent to one another in the inactive region 108 of the IC 102. Various other embodiments depicting such placements of PLINEs are described herein.

Each PLINE 120, 122, 124 is independently coupled to a detection and monitoring circuit 126. The functionality of the detection and monitoring circuit 126 in this embodiment and other embodiments may be provided by the IC 102 as shown or via an external circuit (not shown). According to embodiments, connections may be provided over and/or under one or more of the guard ring 110, crackstop 112, and crackstop 114 to couple PLINEs 120, 122, 124 to the detection and monitoring circuit 126. To this extent, depending upon embodiments, the integrity of the guard ring 110, crackstop 112, and crackstop 114 is not compromised or is minimally compromised by the connections (e.g., no holes are formed in or through the guard ring 110, crackstop 112, or crackstop 114).

The detection and monitoring circuit 126 is configured to sense a change in an electrical characteristic (e.g., resistance) of each independent PLINE 120, 122, 124, where the change in the electrical characteristic indicates the presence of a crack at PLINE 120, 122, 124. The detection and monitoring circuit 126 may also be configured to monitor the progression of a detected crack through the inactive region 108 of the IC 102 and to alert an end user of a status and/or threat level of the detected crack (e.g., impending crack breach into the active region 106 of the IC 102). For example, if a crack 130 (e.g., formed when dicing the silicon wafer including the IC 102) propagates to, and forms a break in/through, PLINE 124, the detection and monitoring circuit 126 may detect an increase (e.g., by orders of magnitude) in the resistance of PLINE 124 (e.g., due to the presence of an open circuit in PLINE 124). To this extent, the detection and monitoring circuit 126 may inform an end user that a crack breach into/through PLINE 124 has occurred and to be on alert. If the crack 130 continues to propagate through the inactive region 108 of the IC 102 past the crackstop 114, and forms a break in/through PLINE 122, the detection and monitoring circuit 126 may detect an increase in the resistance of PLINE 122 and may inform an end user that growth of the crack 130 is continuing. In addition, the detection and monitoring circuit 126 may inform the end user that the IC 102 should be replaced in an approximate amount of time (e.g., 12 months) days to avoid a failure of the IC 102. If the crack 130 propagates through and past the crackstop 112 and into/through PLINE 120, the detection and monitoring circuit 126 may detect an increase in the resistance of PLINE 120 and may inform the end user that a failure of the IC 102 is imminent and that the IC 102 should be immediately replaced.

As described above, and depicted in FIG. 1, the crack detecting and monitoring system 100 may be configured to provide early, intermediate, and final warnings of an impending crack breach into the active region 106 of the IC 102. In other embodiments, the crack detecting and monitoring system can be configured to provide aging information. For example, the crack detecting and monitoring system 100 can be calibrated such that an approximate time to failure of an IC 102 can be determined. For instance, in a stable operating environment, the growth rate of a crack in a test IC 102 can be determined/estimated (e.g., X microns a year). Based on the growth rate, PLINEs 120, 122. 124 can be spaced at specific distances from the active region 106 of the IC 102, where the distances correspond to different remaining operational lifetimes of the IC 102. When a crack propagates into/through a given PLINE, the detection and monitoring circuit 126 may alert an end user that a crack has reached that PLINE and that if conditions remain stable, the crack may reach another location on the IC 102 (e.g., the active region 106 of the IC 102) in a certain amount of time. Such an alert may include, for example, "A crack has reached PLINE A, located B microns from the active region of the chip. If conditions remain stable, the crack may reach the active area of the IC in approximately 16 months. To avoid failure, replace the IC within 12 months."

Figure 2:
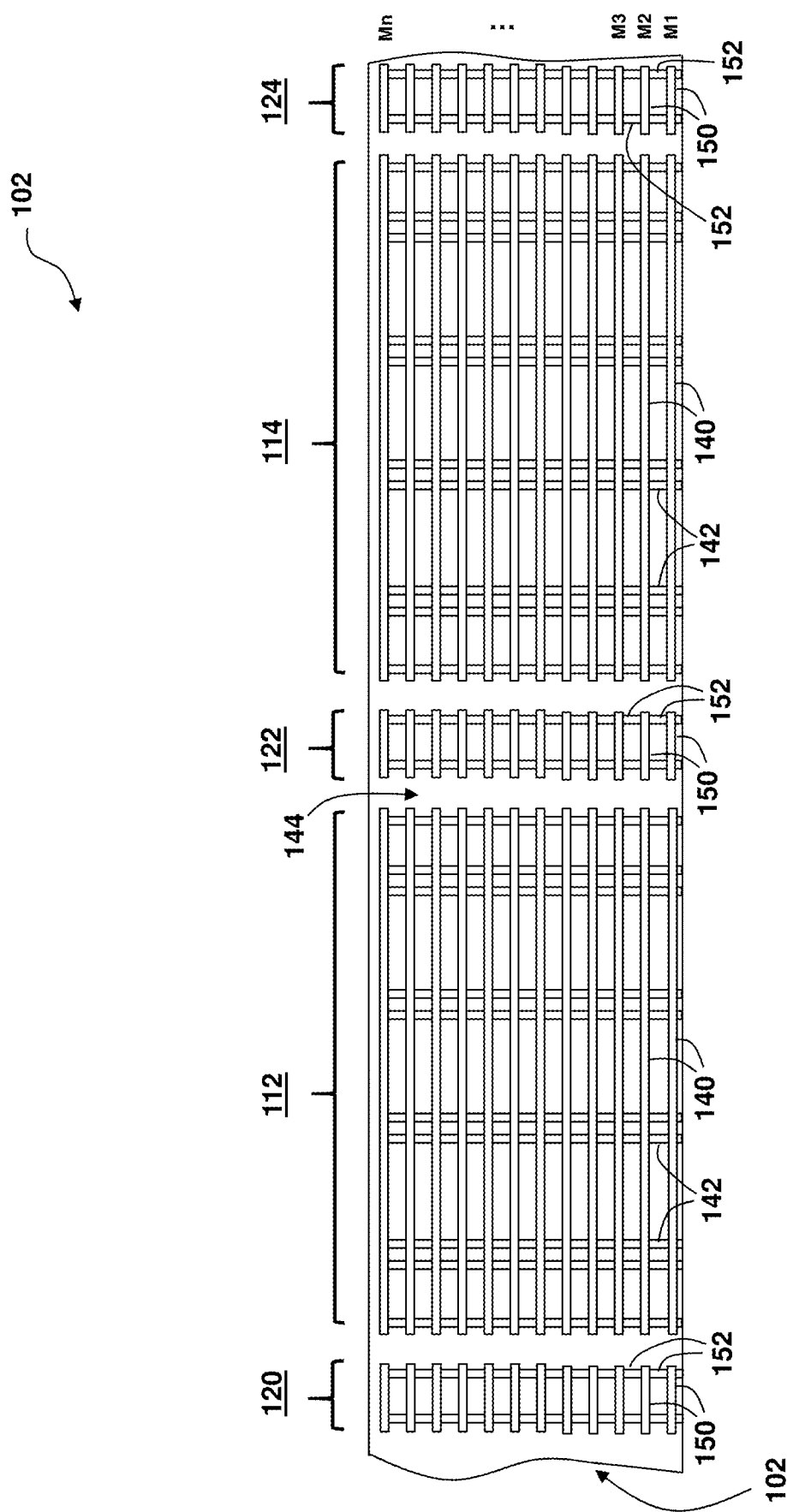
FIG. 2 depicts a cross-sectional view of the IC of FIG. 1 taken along line A-A according to embodiments.

FIG. 2 depicts a partial cross-sectional view of the IC 102 of FIG. 1 taken along line A-A according to embodiments. As shown, the crackstops 112, 114 may be formed using a plurality of layers of metal segments 140 interconnected by a plurality of metal interconnects 142 (e.g., vias, viabars, etc.) and embedded in a dielectric material 144. The metal segments 140 may be formed in metallization layers M1, M2, . . . , Mn of the IC 102 (e.g., back end of line (BEOL) metallization layers). The crackstops 112, 114 may have a similar configuration as depicted in FIG. 2 or may include different configurations of metal segments 140 and/or metal interconnects 142 (e.g., the numbers, shapes, spacings, dimensions, etc. of the metal segments 140 and metal interconnects 142 may vary between the crackstops 112, 114).

Each PLINE 120, 122, 124 may include a plurality of layers of electrically conductive metal segments 150 interconnected by a plurality of electrically conductive metal interconnects 152 (e.g., vias, viabars, etc.) and embedded in the dielectric material 144. PLINEs 120, 122, 124 (and other PLINES disclosed herein) may be formed during the same processing steps as the crackstops 112, 114 and may formed of any suitable metal including, for example, copper, tungsten, aluminum, silver, gold, other metals, or alloys thereof. The metal segments 150 may also be formed in metallization layers M1, M2, M3, . . . , Mn of the IC 102. As with the crackstops 112, 114, PLINEs 120, 122, 124 may have similar or different configurations of metal segments 150 and/or metal interconnects 152 (e.g., the numbers, shapes, spacings, dimensions, etc. of the metal segments 150 and metal interconnects 152 may vary between PLINEs 120, 122, 124).

Figure 3:
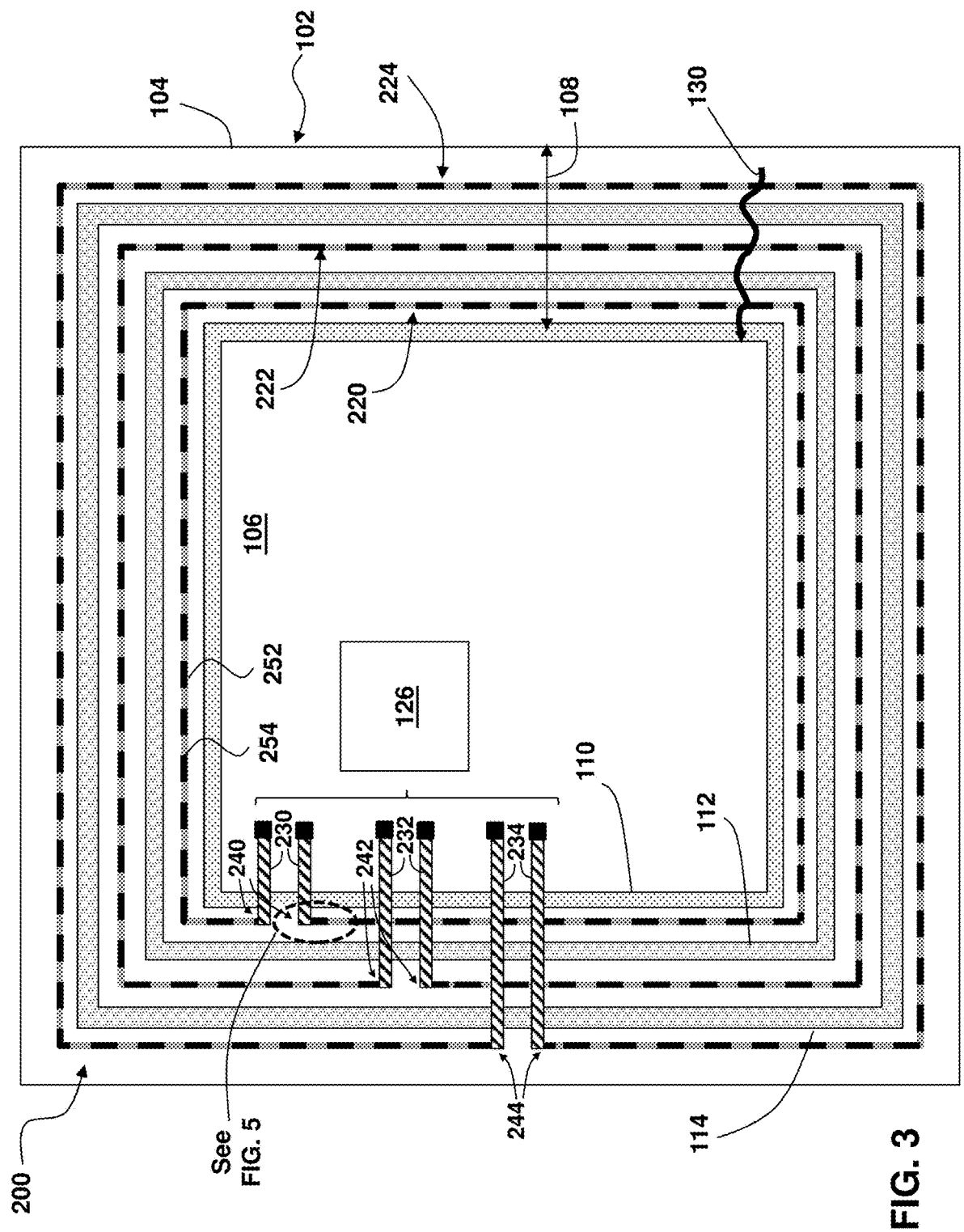
FIG. 3 depicts a plan view of an IC including a system for detecting and monitoring the growth of cracks according to embodiments, where the crack detecting and monitoring system includes perimeter lines (PLINEs) and straddling connections.
Figure 4:
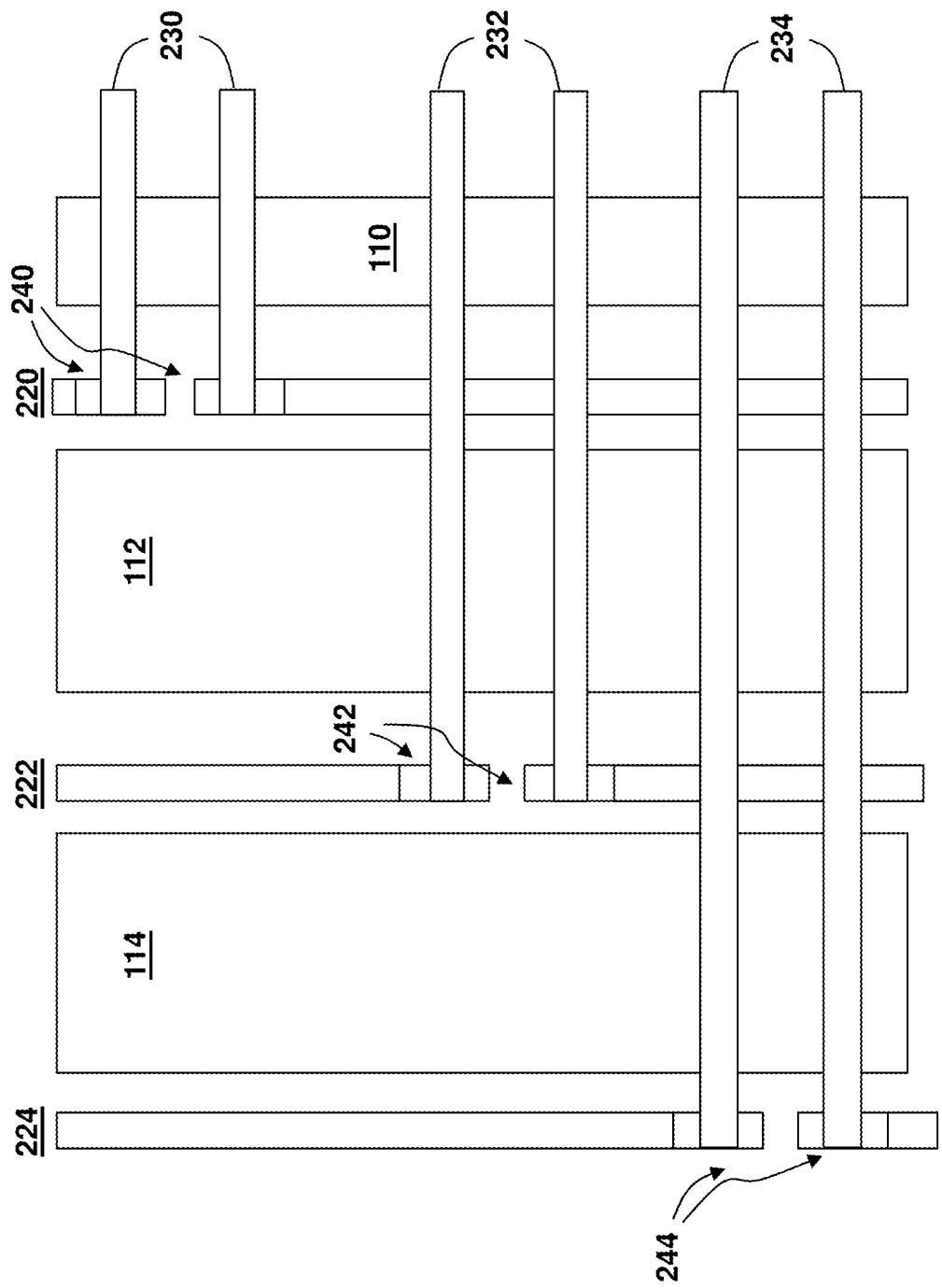
FIG. 4 depicts an enlarged, partial plan view of the IC of FIG. 3 according to embodiments.
Figure 5:
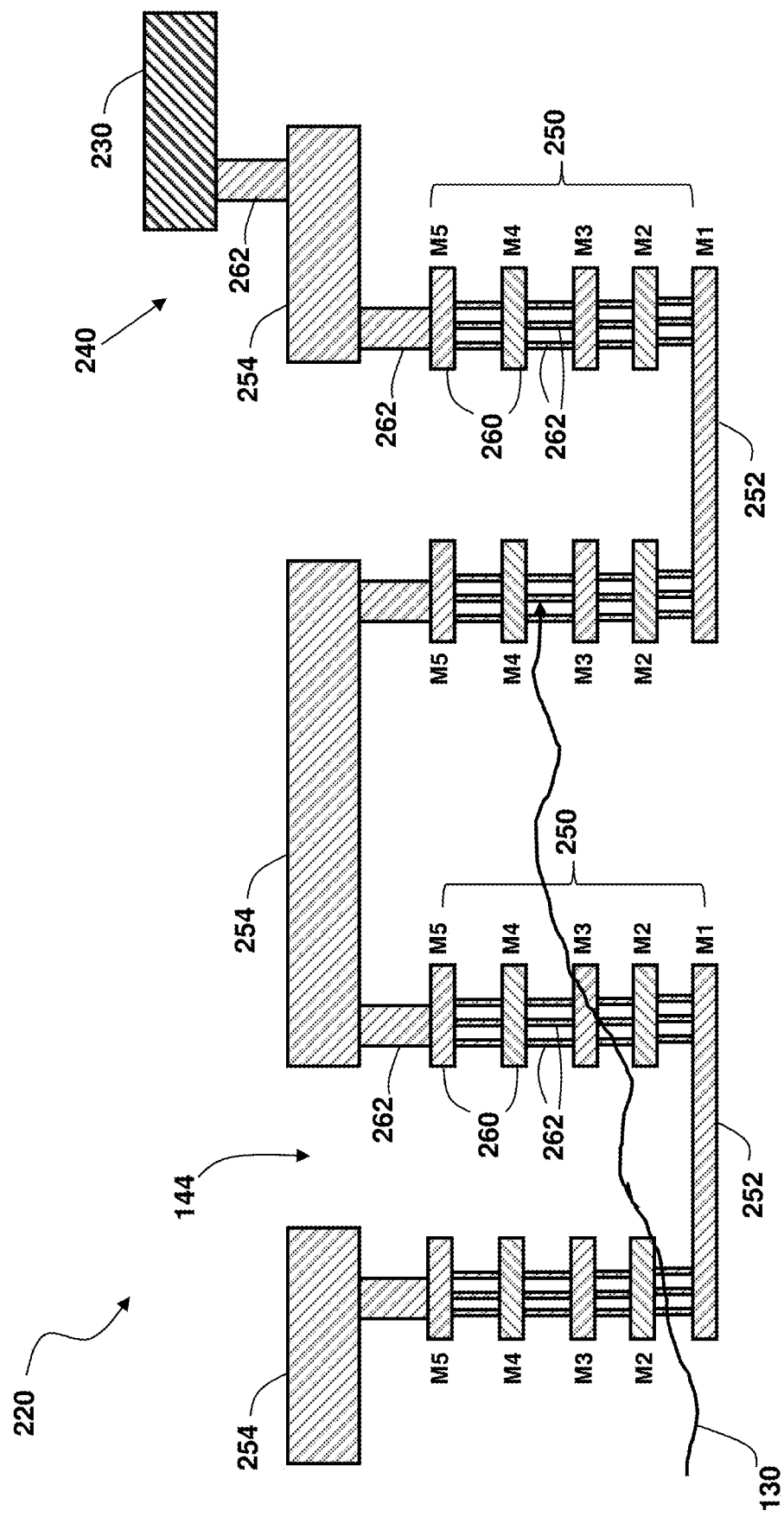
FIG. 5 depicts a partial cross-sectional view of a PLINE in the IC of FIG. 3 according to embodiments.

According to embodiments, PLINEs may be coupled to the detection and monitoring circuit 126 via connections that extend over (e.g., straddling connections) or under (e.g., tunneling connections) one or more of the guard ring 110, crackstop 112, and crackstop 114. For example, an IC 102 including a crack detecting and monitoring system 200 with electrically conductive PLINEs 220, 222, 224 and electrically conductive straddling metal connections 230, 232, 234 according to embodiments is depicted in FIGS. 3-5, referred to concurrently. FIG. 3 depicts a plan view of the IC 102. FIG. 4 depicts a partial, enlarged plan view of the IC of FIG. 3. FIG. 5 depicts a partial cross-sectional view along a length of a PLINE (e.g., PLINE 220 in FIG. 3). Although three PLINEs 220, 222, 224 are utilized in this embodiment, it should be evident that the crack detecting and monitoring system 200 may include a larger or smaller number of PLINEs (e.g., one or more). In addition, PLINEs may be formed in other locations in the inactive region 108 of the IC 102, and/or a plurality of PLINEs may be formed adjacent to one another in the inactive region 108 of the IC 102.

Similar to the crack detecting and monitoring system 100 depicted in FIG. 1, the crack detecting and monitoring system 200 is configured to detect and monitor the growth of one or more cracks 130 in the inactive region 108 of the IC 102, before any cracks propagate into the active region 106 of the IC 102. In general, the crack detecting and monitoring system 200 may include at least one PLINE formed in the inactive region 108 of the IC 102. For example, as shown in FIG. 3, a first PLINE 220, second PLINE 222, and third PLINE 224 may be formed in the inactive region 108 of the IC 102 and may be independently coupled to the detection and monitoring circuit by respective straddling connections.

First PLINE 220 may be formed about an outer periphery of the guard ring 110, between the guard ring 110 and the crackstop 112. Second PLINE 222 may be formed about an outer periphery of the crackstop 112, between the crackstop 112 and the crackstop 114. Third PLINE 224 may be formed about an outer periphery of the crackstop 114. Opposing ends 240 of first PLINE 220 may be coupled via straddling metal connections 230 to the detection and monitoring circuit 126. The straddling metal connections 230 may extend over, and may be electrically isolated from, the guard ring 110. Opposing ends 242 of second PLINE 222 may be coupled via straddling metal connections 232 to the detection and monitoring circuit 126. As shown, the straddling metal connections 232 may extend over, and may be electrically isolated from, the crackstop 112, PLINE 220, and the guard ring 110. Opposing ends 244 of third PLINE 224 may be coupled via straddling metal connections 234 to the detection and monitoring circuit 126. The straddling metal connections 234 may extend over, and may be electrically isolated from, the crackstop 114, the crackstop 112, PLINE 222, PLINE 220, and the guard ring 110. Electrical isolation can be provided, for example, using one or more layers of a dielectric material 144 and/or the like.

A cross-sectional view along an end portion of PLINE 220 in FIG. 3 according to embodiments is depicted in FIG. 5. PLINEs 222 and 224 may each have a similar or different configuration than PLINE 220. As shown, PLINE 220 may include a plurality of electrically conductive metal sections 250 that may be daisy-chained (e.g., stitched) together by an alternating sequence of lower and upper electrically conductive metal connectors 252, 254. The metal connectors 252, 254 may have similar or different lengths. The lengths of the metal connectors 252, 254 may affect the crack detection accuracy of PLINE 220. For example, a larger number (e.g., higher density) of metal sections 250 may be daisy-chained together when using shorter metal connectors 252, 254. In general, the minimum lengths of the metal connectors 252, 254 may be governed by the processing rules used to form the IC 102. For example, the lithography tools used to fabricate the metal connectors 252, 254 in respective metallization layers of the IC 102 may only be capable of producing metal lines having a certain minimum length in a particular dielectric layer.

According to embodiments, the lower metal connectors 252 may be formed, for example, in a lower BEOL metallization layer of the IC 102 (e.g., M1 metallization layer as shown). The upper metal connectors 254 may be formed in an upper metallization layer of the IC 102. According to embodiments, the lengths of the metal connectors 252, 254 may be, for example, in the range of tens of nanometers to several microns (e.g., depending on manufacturing limitations and/or other factors). As shown in FIG. 5, a crack 130 propagating into/through PLINE 220 may form a break in/through one or more of the metal sections 250, which may be sensed (e.g., as an increase in resistance of PLINE 220) by the detection and monitoring circuit 126.

The metal sections 250 may include a plurality of layers of electrically conductive metal segments 260 interconnected using a plurality of electrically conductive metal interconnects 262 (e.g., vias, viabars, etc.) and embedded in a dielectric material 144. The metal segments 262 may be formed in metallization layers of the IC 102 (e.g., metallization layers M2-M5 as shown). One or more metal interconnects 262 may also be used to couple the metal sections 250 to respective lower and upper metal connectors 252, 254. The upper metal connector 254 located at an end 240 of PLINE 220 may be coupled by a metal interconnect 262 to a straddling metal connection 230.

Figure 6:
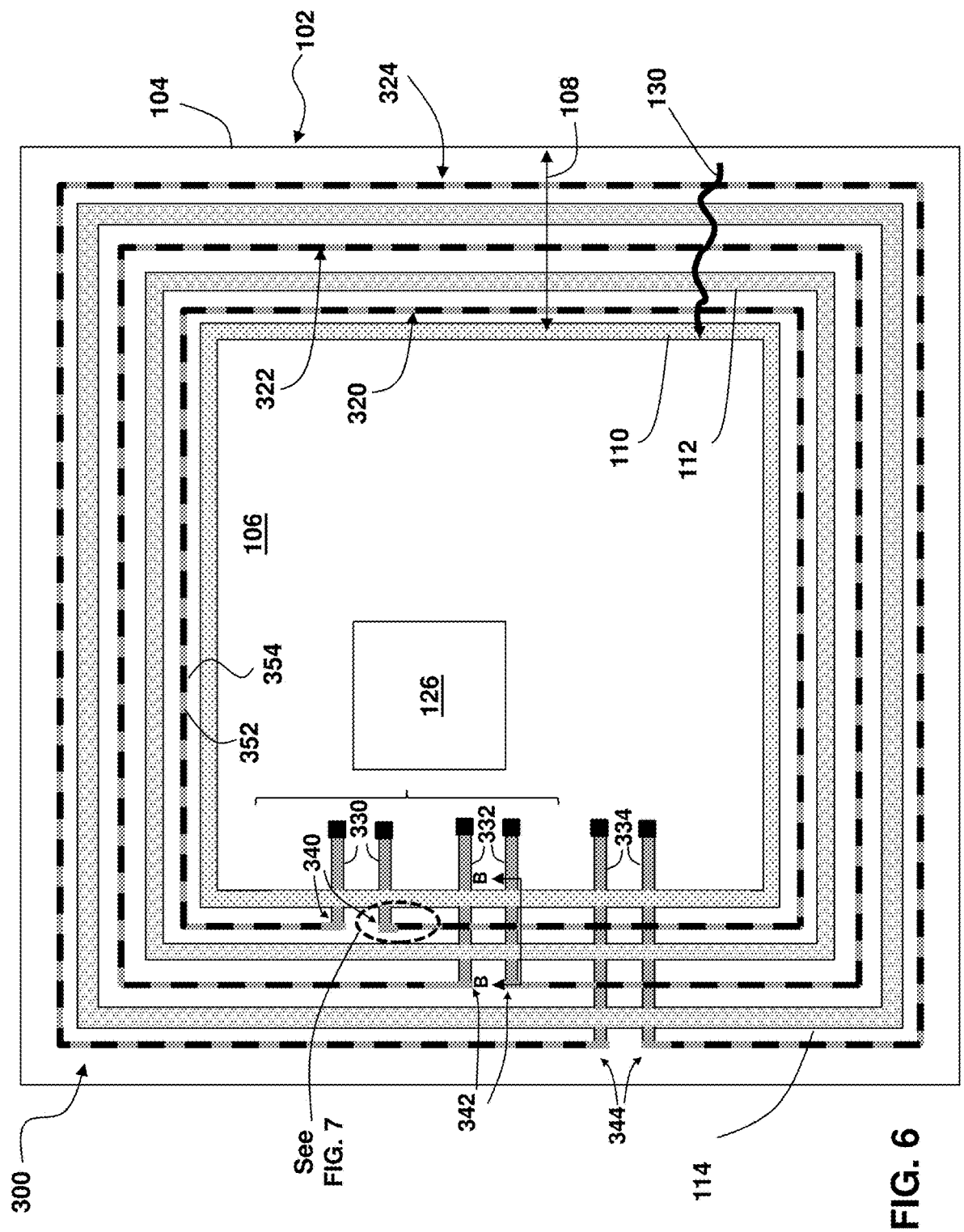
FIG. 6 depicts a plan view of an IC including a system for detecting and monitoring the growth of cracks according to embodiments, where the crack detecting and monitoring system includes PLINEs and tunneling connections.
Figure 7:
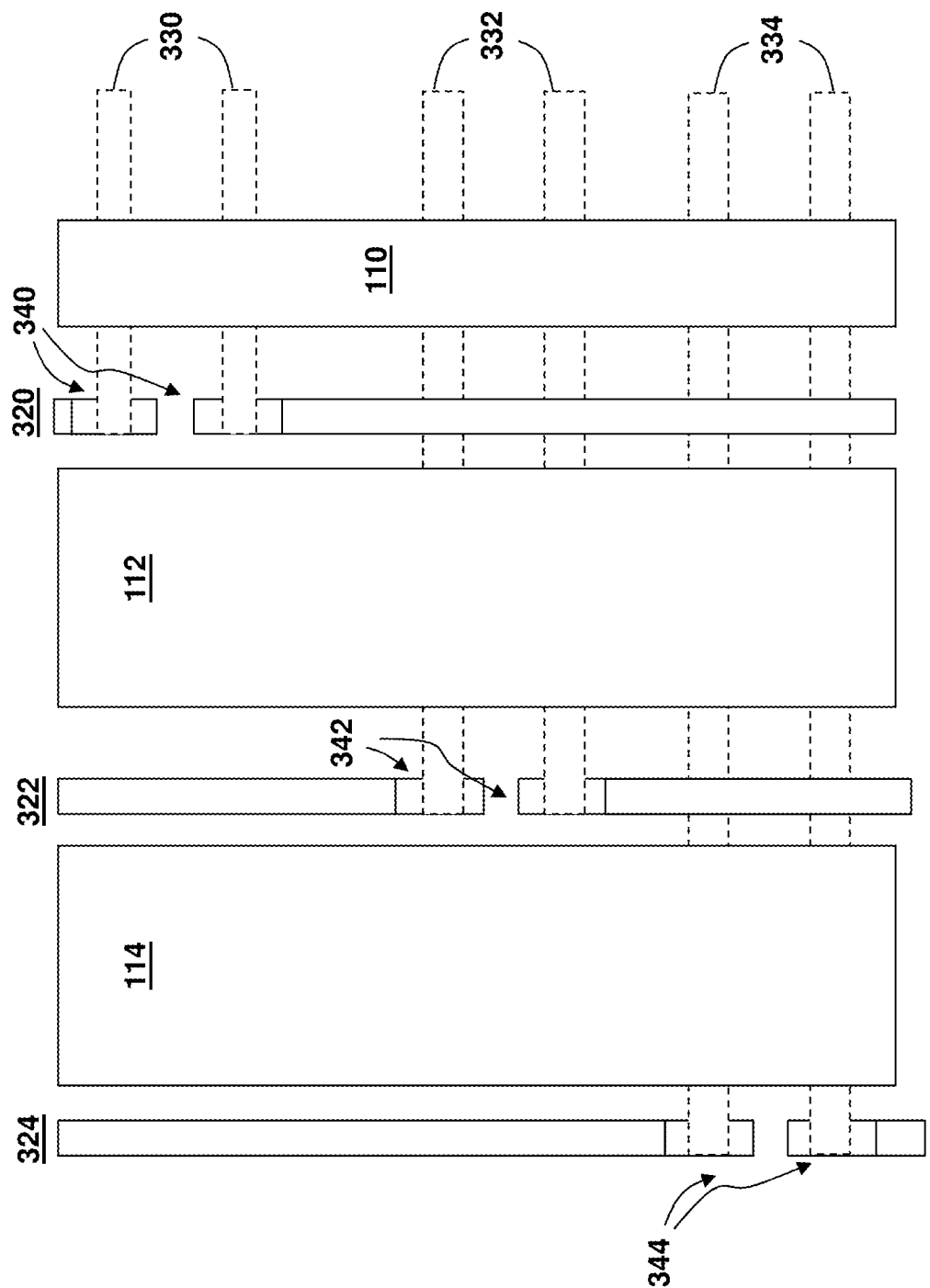
FIG. 7 depicts an enlarged, partial plan view of the IC of FIG. 6 according to embodiments.
Figure 8:
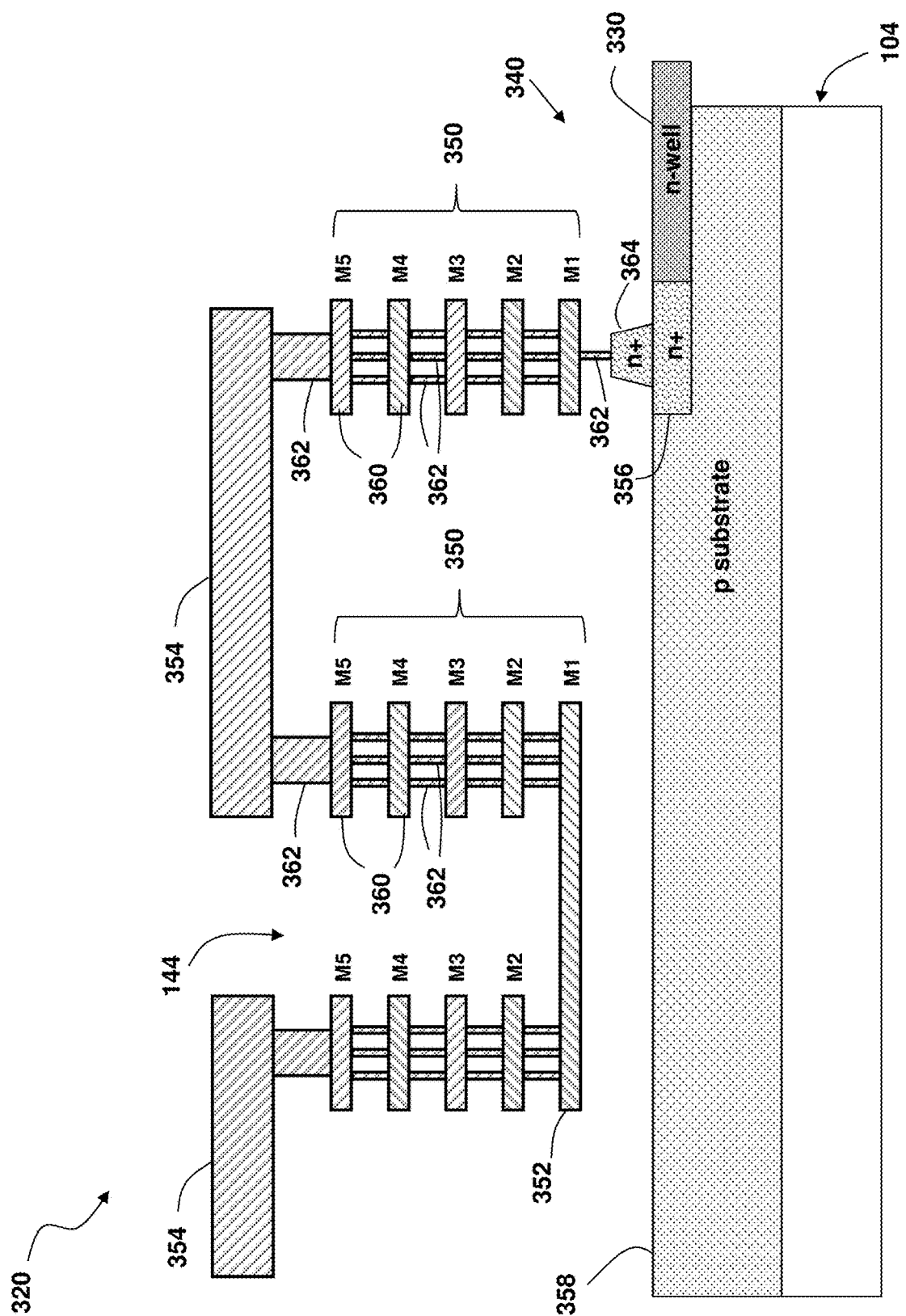
FIG. 8 depicts a partial cross-sectional view of a PLINE in the IC of FIG. 6 according to embodiments.
Figure 9:
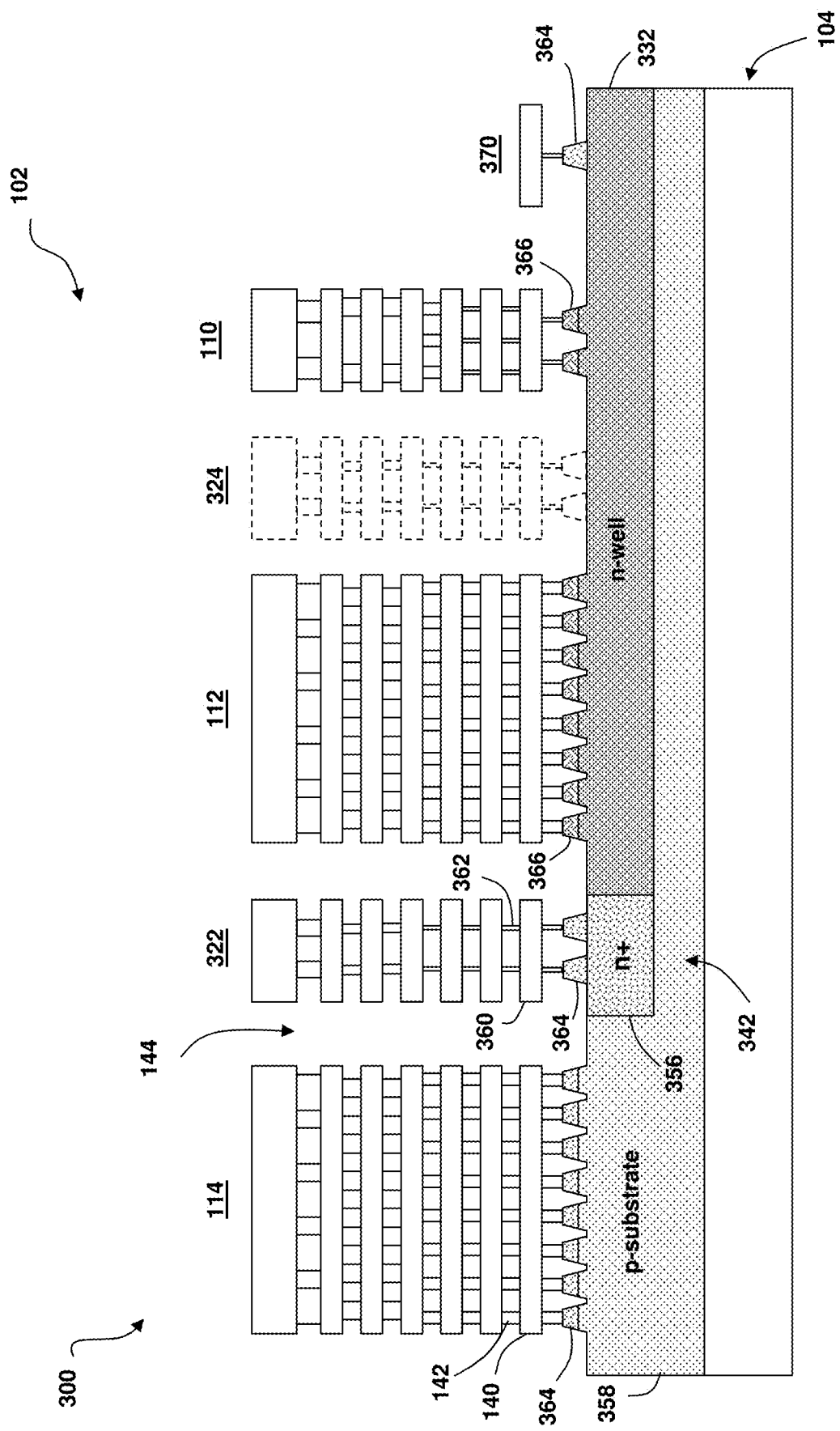
FIG. 9 depicts a partial cross-sectional view of the IC of FIG. 6 taken along line B-B according to embodiments.

As described above, according to embodiments, PLINEs may be coupled to the detection and monitoring circuit 126 via connections that extend over (e.g., straddling connections) or under (tunneling connections) one or more of the guard ring 110, crackstop 112, and crackstop 114. An IC 102 including a crack detecting and monitoring system 300 including tunneling connections according to embodiments is depicted in FIGS. 6-9, referred to concurrently. For example, FIG. 6 depicts a plan view of an IC 102 including a plurality of independent and electrically conductive PLINEs 320, 322, 324 and electrically conductive tunneling connections 330, 332, 334. FIG. 7 depicts an enlarged, partial plan view of the IC 102 of FIG. 6. FIG. 8 depicts a partial cross-sectional view along a length of a PLINE (e.g., PLINE 320) in FIG. 6. FIG. 9 depicts a partial cross-sectional view of the crack detecting and monitoring system 300 taken along line B-B of FIG. 6. Although three PLINEs 320, 322, 324 are utilized in this embodiment, it should be evident that the crack detecting and monitoring system 300 may include a larger or smaller number of PLINEs (e.g., one or more). In addition, PLINEs may be formed in other locations in the inactive region 108 of the IC 102 and/or and a plurality of PLINEs may be formed adjacent to one another in the inactive region 108 of the IC 102.

Similar to the crack detecting and monitoring systems 100, 200 depicted in FIGS. 1 and 3, the crack detecting and monitoring system 300 is configured to detect and monitor the growth of cracks in the inactive region 108 of the IC 102, before any cracks propagate into the active region 106 of the IC 102. In general, the crack detecting and monitoring system 300 may include at least one PLINE formed in the inactive region 108 of the IC 102. For example, as shown in FIG. 6, a first PLINE 320, second PLINE 322, and third PLINE 324 may be formed in the inactive region 108 of the IC 102.

PLINE 320 may be formed about an outer periphery of the guard ring 110, between the guard ring 110 and the crackstop 112. Second PLINE 322 may be formed about an outer periphery of the crackstop 112, between the crackstop 112 and the crackstop 114. Third PLINE 324 may be formed about an outer periphery of the crackstop 114.

Opposing ends 340 of first PLINE 320 may be coupled via electrically conductive semiconductor tunneling connections 330 to the detection and monitoring circuit 126. The tunneling connections 330 may extend under, and may be electrically isolated from, the guard ring 110. Opposing ends 342 of second PLINE 322 may be coupled via semiconductor tunneling connections 332 to the detection and monitoring circuit 126. As shown, the tunneling connections 332 may extend under, and may be electrically isolated from, the crackstop 112 and the guard ring 110. Opposing ends 344 of third PLINE 324 may be coupled via semiconductor tunneling connections 334 to the detection and monitoring circuit 126. The tunneling connections 334 may extend under, and may be electrically isolated from, the crackstop 114, the crackstop 112, and the guard ring 110. According to embodiments, the tunneling connections 344 may also be electrically isolated from PLINEs 320, 322 and the tunneling connections 342 may also be electrically isolated from PLINE 320. As described hereinafter, the tunneling connections 340, 342, 344 may be formed using doped regions of the substrate 104 of the IC 102.

A cross-sectional view along an end portion of PLINE 320 of FIG. 6 according to embodiments is depicted in FIG. 8. PLINEs 322 and 324 may each have a similar or different configuration than PLINE 320. As shown, PLINE 320 may include a plurality of electrically conductive metal sections 350 that may be daisy-chained together by an alternating sequence of electrically conductive lower metal connectors 352 (only one shown) and electrically conductive upper metal connectors 354. The metal connectors 352, 354 may have similar or different lengths. The lengths of the metal connectors 352, 354 may affect the crack detection accuracy of PLINE 320. For example, a larger number (e.g., higher density) of metal sections 350 may be daisy-chained together when using shorter metal connectors 352, 354. In general, the minimum lengths of the metal connectors 352, 354 may be governed by the processing rules used to form the IC 102. For example, lithography tools used to fabricate the metal connectors 352, 354 in respective metallization layers of the IC 102 may only be capable of producing metal lines having a certain minimum length in a particular dielectric layer. According to embodiments, the lower metal connectors 352 may be formed, for example, in a lower BEOL metallization layer of the IC 102 (e.g., M1 metallization layer as shown). The upper metal connectors 354 may be formed in an upper metallization layer of the IC 102. According to embodiments, the lengths of the metal connectors 352, 354 may be, for example, in the range of tens of nanometers to several microns (e.g., depending on manufacturing limitations and/or other factors).

The metal sections 350 may include a plurality of layers of electrically conductive metal segments 360 interconnected by a plurality of electrically conductive metal interconnects 362 (e.g., vias, viabars, etc.) and embedded in a dielectric material 144. The metal segments 362 may be formed in metallization layers of the IC 102 (e.g., BEOL metallization layers M1-M5 as shown). One or more metal interconnects 362 may also be used to couple adjacent metal sections 350 to respective upper metal connectors 352. The lowermost metal segment 360 (e.g., M1 metallization layer) of at least one of the metal sections 350 may be coupled to a doped region 356 of the semiconductor substrate 104 by at least one metal interconnect 362 and doped semiconductor interconnect 364.

As depicted in FIG. 8, the doped semiconductor region 356 may be formed in a doped portion 358 of the semiconductor substrate 104 of the IC 102. At least one doped semiconductor interconnect 364 may be formed over the doped semiconductor region 356 to couple a metal section 350 located at an end 340 of PLINE 320 to a tunneling connection 330 which, in this embodiment, is formed by a doped semiconductor well formed in the doped portion 358 of the semiconductor substrate 104. The metal section 350 may be coupled to the doped semiconductor interconnect 364 using one or more metal interconnects 362. The doping of the semiconductor region 356, the semiconductor interconnect 364, and the tunneling connection 330 allows the passage of an electrical signal when measuring the electrical characteristic (e.g., resistance) of PLINE 320. The semiconductor region 356 and the semiconductor interconnect 364 may be n⁺-doped as shown in FIG. 8 or p⁺-doped in other embodiments. Doping may be provided, for example, using ion implantation or any other suitable process.

When using an n⁺-doped semiconductor region 356 (with an n⁺-doped semiconductor interconnect 364) as depicted in FIG. 8, the n⁺-doped semiconductor region 356 may be formed in a p-doped region 358 of the semiconductor substrate 104 of the IC 102. As further illustrated in FIG. 8, in this doping scheme, the n⁺-doped semiconductor region 356 located adjacent an end 340 of PLINE 320 may be coupled to the detection and monitoring circuit 126 via a tunneling connection 330 formed using an n-doped semiconductor well (n-doped well) formed in the p-doped region 358 of the semiconductor substrate 104 of the IC 102.

According to other embodiments, a p⁺-doped semiconductor region and a p⁺-doped semiconductor interconnect may be used in lieu of the n+-doped semiconductor region 356 and the n⁺-doped semiconductor interconnect 364. The p⁺-doped semiconductor region may be formed in an n⁺-doped region of the semiconductor substrate 104 of the IC 102. In addition, the p⁺-doped semiconductor region located adjacent the end 340 of PLINE 320 may be coupled to the detection and monitoring circuit 126 via a p-doped semiconductor well tunneling connection 330 formed in the n-doped region of the substrate 104 of the IC 102.

FIG. 9 depicts a partial cross-sectional view of the IC 102 taken along line B-B of FIG. 6 according to embodiments. As shown, an n-doped semiconductor well tunneling connection 332 (hereafter n-doped tunneling connection 332) may be formed in the p-doped region 358 of the substrate 104 of the IC 102 to couple the n⁺-doped semiconductor region 356 adjacent an end 342 of PLINE 322 to the detection and monitoring circuit 126 via an I/O connection 370. PLINE 322 may be coupled to the n⁺-doped semiconductor region 356 by at least one n⁺-doped semiconductor interconnect 364. At least one n⁺-doped semiconductor interconnect 364 may also be used to couple the n-doped tunneling connection 332 to the I/O connection 370.

The crackstop 114 may be positioned over the p-doped region 358 of the semiconductor substrate 104. The crackstop 114 may be coupled to the p-doped region 358 using at least one n⁺-doped semiconductor interconnect 364. A bias applied to the p-doped region 358 may be used to reverse bias the pn junction(s) formed between the p-doped region 358 and the at least one n⁺-doped semiconductor interconnect 364 to electrically isolate the crackstop 114 from the p-doped region 358.

The n-doped tunneling connection 332 extends beneath and is electrically isolated from the crackstop 112 and the guard ring 110. The crackstop 112 may be coupled to the n-doped tunneling connection 332 using at least one p⁺-doped semiconductor interconnect 366. Similarly, the guard ring 110 may be coupled to the n-doped tunneling connection 332 using at least one p⁺-doped semiconductor interconnect 366. The reverse biased pn junctions formed between the p⁺-doped semiconductor interconnect(s) 366 and the n-doped tunneling connection 332 electrically isolate the crackstop 112 and the guard ring 110 from the n-doped tunneling connection 332.

According to other embodiments, any of the crack detecting and monitoring systems described herein may utilize both types of connecting structures to electrically connect PLINEs to the detection and monitoring circuit 126. For example, a first PLINE in a crack detecting and monitoring system may be electrically connected to the detection and monitoring circuit 126 using metal straddling connectors, a second PLINE in the same crack detecting and monitoring system may be electrically connected to the detection and monitoring circuit 126 using doped semiconductor tunneling connectors, while a third PLINE in the same crack detecting and monitoring system may be connected using both straddling and tunneling connectors.

Figure 10:
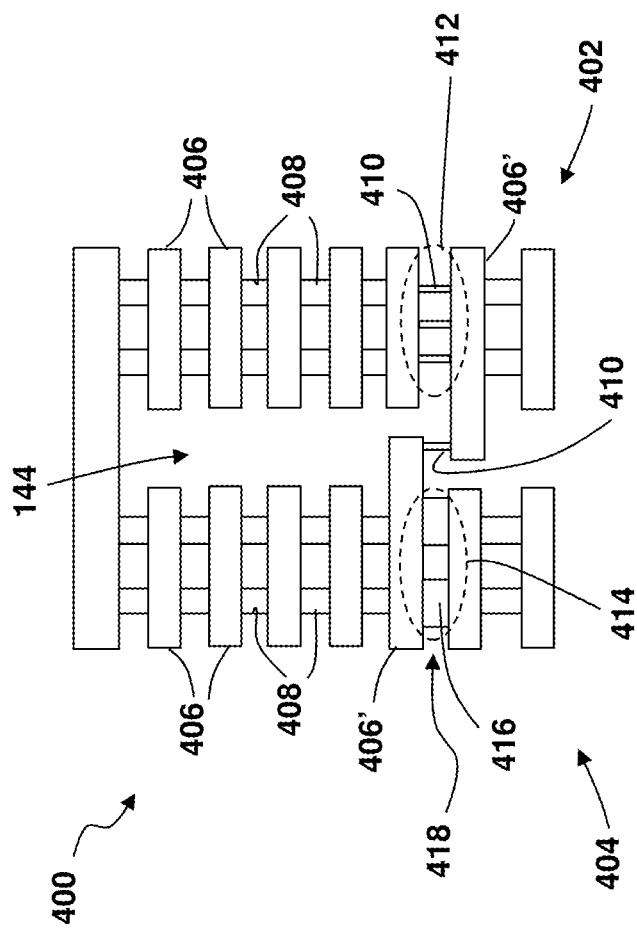
FIG. 10 depicts a cross-sectional view of a PLINE for directing and trapping a propagating crack according to embodiments.

Any/all of the PLINEs described herein can be configured to direct and trap a crack propagating through the inactive region 108 of an IC 102. For example, a cross-sectional view of a PLINE 400 according to embodiments for directing and trapping a crack is depicted in FIG. 10. As shown, PLINE 400 includes first and second electrically conductive interconnected metal sections 402, 404. The metal section 404 may include a plurality of layers of electrically conductive metal segments 406 interconnected using a high density arrangement of electrically conductive metal interconnects 408 (e.g., vias, viabars, etc.) and embedded in a dielectric material 144. The metal section 402 may also include a plurality of layers of electrically conductive metal segments 406 interconnected using a high density arrangement of the metal interconnects 408 and embedded in a dielectric material 144. In addition, a plurality (2 in this example) of the metal segments 406 in the metal section 402 may be interconnected using a low density arrangement of electrically conductive metal interconnects 410 (e.g., vias, viabars, etc.). The metal interconnects 410 form a weakened area 412 in the metal section 402 that effectively attracts a crack propagating toward PLINE 400. An elongated metal segment 406' in the metal section 402 may also be coupled to an elongated metal segment 406' in the metal section 404 by a metal interconnect 410. The metal section 404 may further include a trapping area 414 that has been reinforced in order to trap/slow a crack after it has propagated through the weakened area 412 in the metal section 402. The trapping area 414 may be reinforced, for example, by providing a set of larger/stronger metal interconnects 416 (e.g., wider/thicker than the metal interconnects 408) and/or by embedding the set of metal interconnects 416 (or even the entire metal section 404) in a stronger dielectric material 418 that is less susceptible to cracking (e.g., compared to the dielectric material 144).

According to embodiments, the high density arrangement of metal interconnects 408 and the low density arrangement of metal interconnects 410 may be provided in several different ways. For example, the metal interconnects 408, 410 may arranged in the same pattern, but the metal interconnects 408 may be thicker than the metal interconnects 410. As another example, the metal interconnects 408, 410 may have the same thicknesses, but the metal interconnects 408 may be arranged closer together than the metal interconnects 410.

Figure 11A:
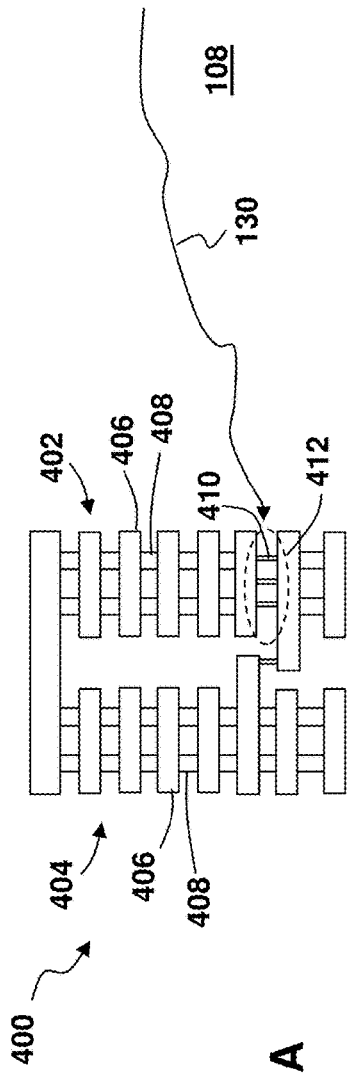
FIGS. 11A, 11B, and 11C depict an example of the crack directing and trapping function of the PLINE of FIG. 10 according to embodiments.
Figure 11B:
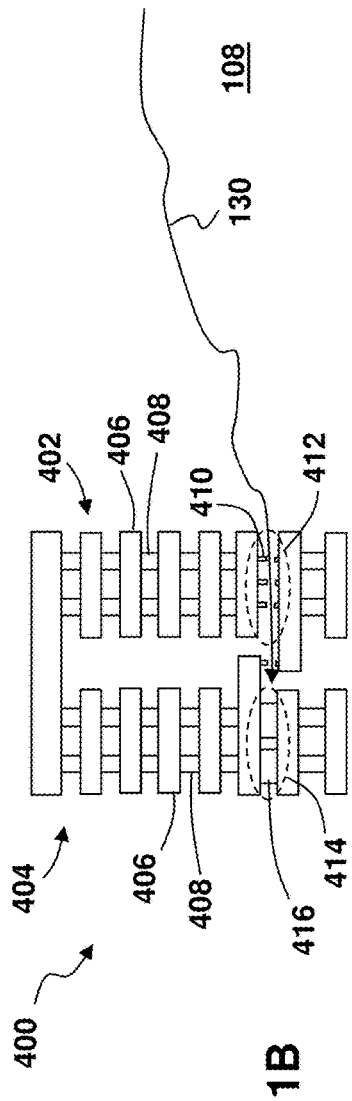
Figure 11C:
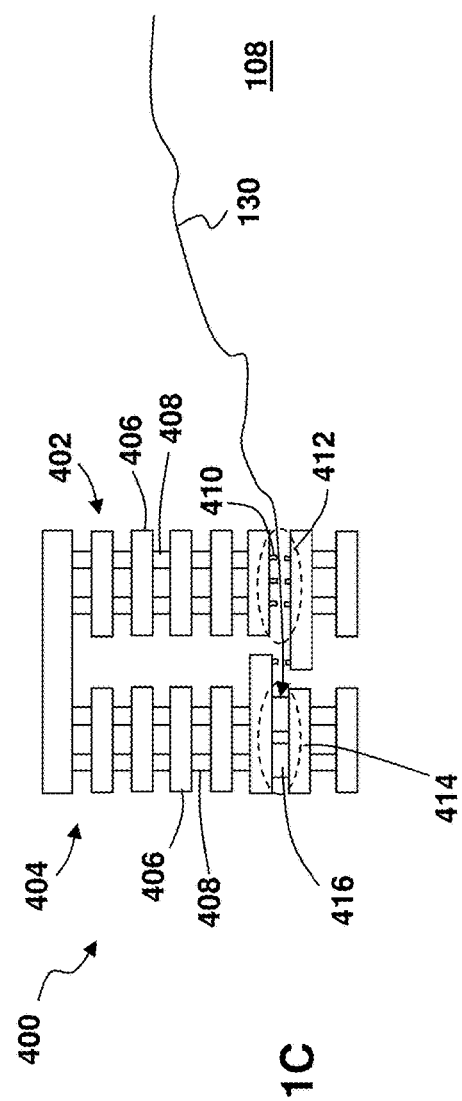

FIGS. 11A, 11B, and 11C depict an example of the crack directing and trapping function of PLINE 400 of FIG. 10 according to embodiments. In FIG. 11A, a crack 130 propagating through the inactive region 108 of an IC is attracted toward the weakened area 412 provided by the metal interconnects 410 in the metal section 402. In FIG. 11B, the crack 130 passes through the low density arrangement of metal interconnects 410 in the metal section 402 toward the trapping area 414. In FIG. 11C, the crack is trapped/slowed, and its energy is dispersed, by the metal interconnects 416 in the trapping area 414. The break in the metal section 402 results in an increase in the resistance of PLINE 400, which is sensed by the determined by the detecting and monitoring circuit 126. If a trapping area 414 is not used, the crack 130 may be trapped/slowed by the high density arrangement of the metal interconnects 408 in the metal section 404.

Figure 12:
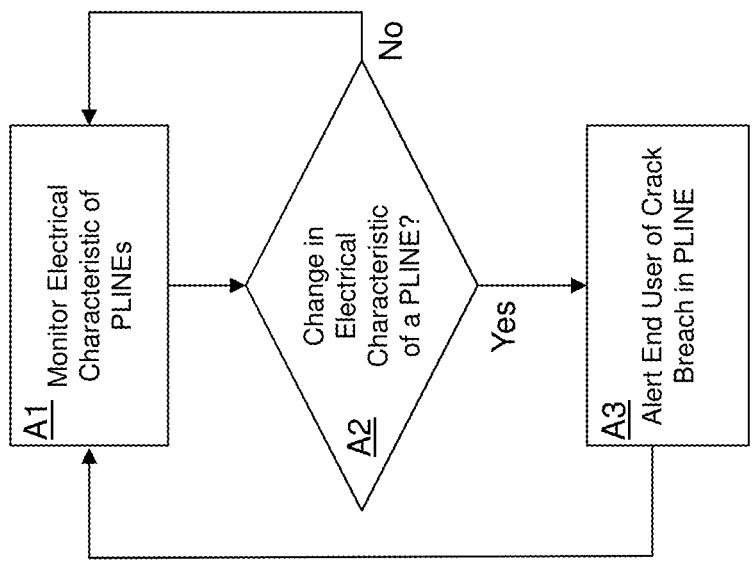
FIG. 12 depicts a flow diagram of a process for detecting and monitoring cracks in an IC according to embodiments.

A flow diagram of a process for detecting and monitoring cracks in an IC according to embodiments is depicted in FIG. 12. At process A1, an electrical characteristic (e.g., resistance) of a plurality of PLINEs positioned in an inactive region of an IC is monitored (continuously or periodically) by a detection and monitoring circuit. If the detection and monitoring circuit senses a change in the electrical characteristic of a PLINE, indicating that a crack has propagated into/through the PLINE (Yes at process A2), flow passes to process A3. Otherwise (No at process A2), flow passes back to process A1.

At process A3, the detection and monitoring circuit provides an alert (e.g., email, text message, system message, and/or the like) to an end user indicating that a crack breach has occurred at the PLINE. The nature of the alert may depend, for example, on the location of the PLINE in the inactive area of the IC (e.g., the closer the PLINE is to the active area of the IC, the stronger the alert). Flow then passes back to process A1.

Figure 13:
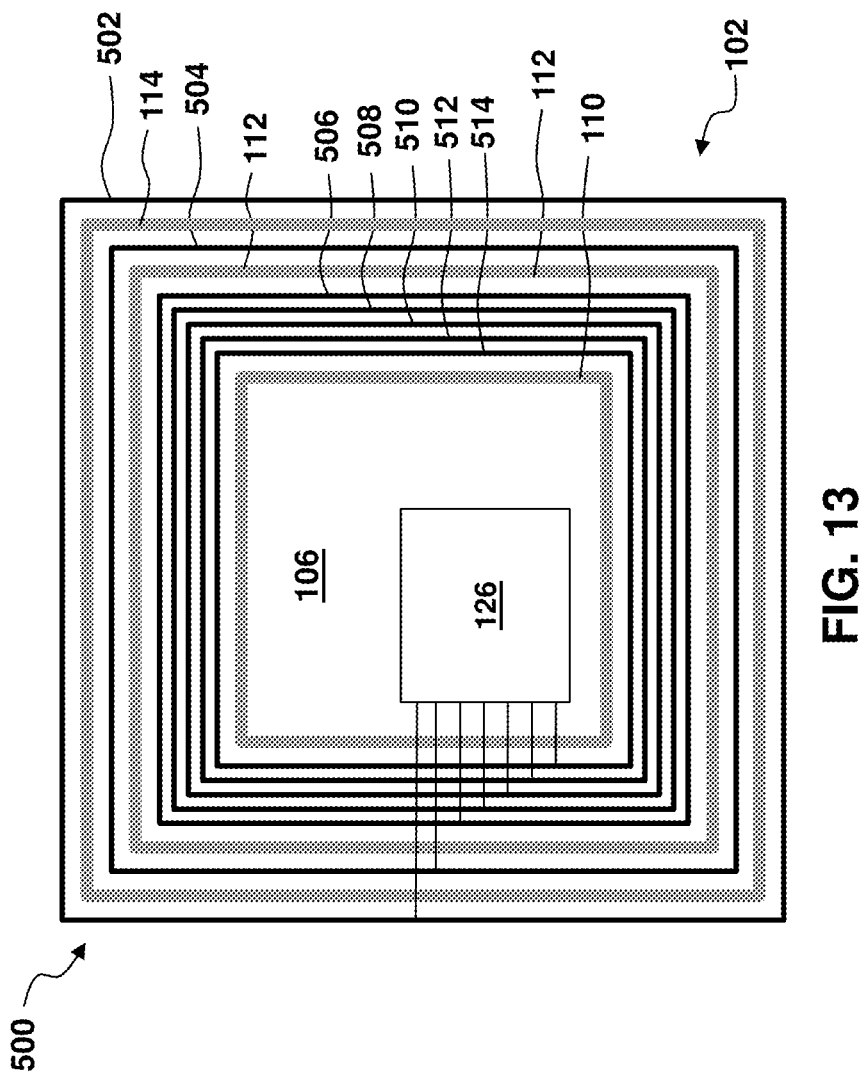
FIG. 13 depicts a plan view of an IC including a crack detecting and monitoring system according to other embodiments.

FIG. 13 depicts a plan view of an IC 102 including a crack detecting and monitoring system 500 according to other embodiments. Similar to the crack detecting and monitoring systems 100, 200, 300, the crack detecting and monitoring system 500 may include an electrically conductive PLINE 502 formed about an outer periphery of the crackstop 114 and an electrically conductive PLINE 504 formed about an outer periphery of the crackstop 112, between the crackstop 112 and the crackstop 114. However, unlike the crack detecting and monitoring systems 100, 200, 300, the crack detecting and monitoring system 500 may include a plurality (e.g., >2) of adjacent, electrically conductive PLINEs formed about an outer periphery of the crackstop 110, between the crackstop 110 and the crackstop 112. For example, as depicted in FIG. 13, five PLINEs 506, 508, 510, 512, 514 may be provided between the crackstop 110 and the crackstop 112. Each PLINE 502, 504, 506, 508, 510, 512, 514 may be discontinuous as described above (or continuous), and may be coupled to the detection and monitoring circuit 126 via respective straddling or tunneling connections.

In operation, the detection and monitoring circuit 126 may be configured to provide a first type of alert when a crack propagates into/through PLINEs 502, 504, and a second type of alert when a crack propagates into/through PLINEs 506, 508, 510, 512, 514. For example, the detection and monitoring circuit 126 may be configured to provide initial alerts to an end user when a crack propagates into/through PLINEs 502, 504. Such alerts may include, for example, "A crack breach has occurred in the IC," and "A crack continues to propagate toward the interior of the ICs.

The crack detecting and monitoring system 500 may be further configured to provide aging information regarding the expected remaining lifetime (e.g., approximate time to failure) of the IC 102 when a crack propagates into/through PLINEs 506, 508, 510, 512, 514. To achieve this functionality, the growth rate of a crack may be determined in a test IC 102. Based on the growth rate, PLINEs 506, 508, 510, 512, 514 may be spaced at specific distances from active region 106 of an IC 102, where each distances is representative of a different remaining operational lifetime of the IC 102. When a crack propagates into/through a given PLINE, the detection and monitoring circuit 126 may alert an end user that a crack has reached that PLINE and that if conditions remain the same, the crack may reach the active region of the IC 102 in a certain number of days/months/years (e.g., 18 months). Alerts may include, for example, "A crack is approaching the active area of the IC. The IC is expected to fail in approximately 18 months." When a crack propagates into/through another PLINE that is closer to the active region 106 of the IC 102, the detection and monitoring circuit 126 may alert an end user that a crack has reached that PLINE and that if conditions remain the same, the crack may reach the active region 106 of the IC 102 in a certain number of days/months/years (e.g., 12 months).

According to embodiments, the detection and monitoring circuit may include at least one sensing circuit for detecting and monitoring a resistance of at least one PLINE. For example, the detection and monitoring circuit may include a series (cascaded) arrangement of a plurality of stages of sensing circuits, where each sensing circuit is configured to sense the resistance of a corresponding PLINE. A enable signal generated by a sensing circuit is used to activate the next sensing circuit in the plurality of stages of sensing circuits as a crack propagates through the IC.

Figure 14:
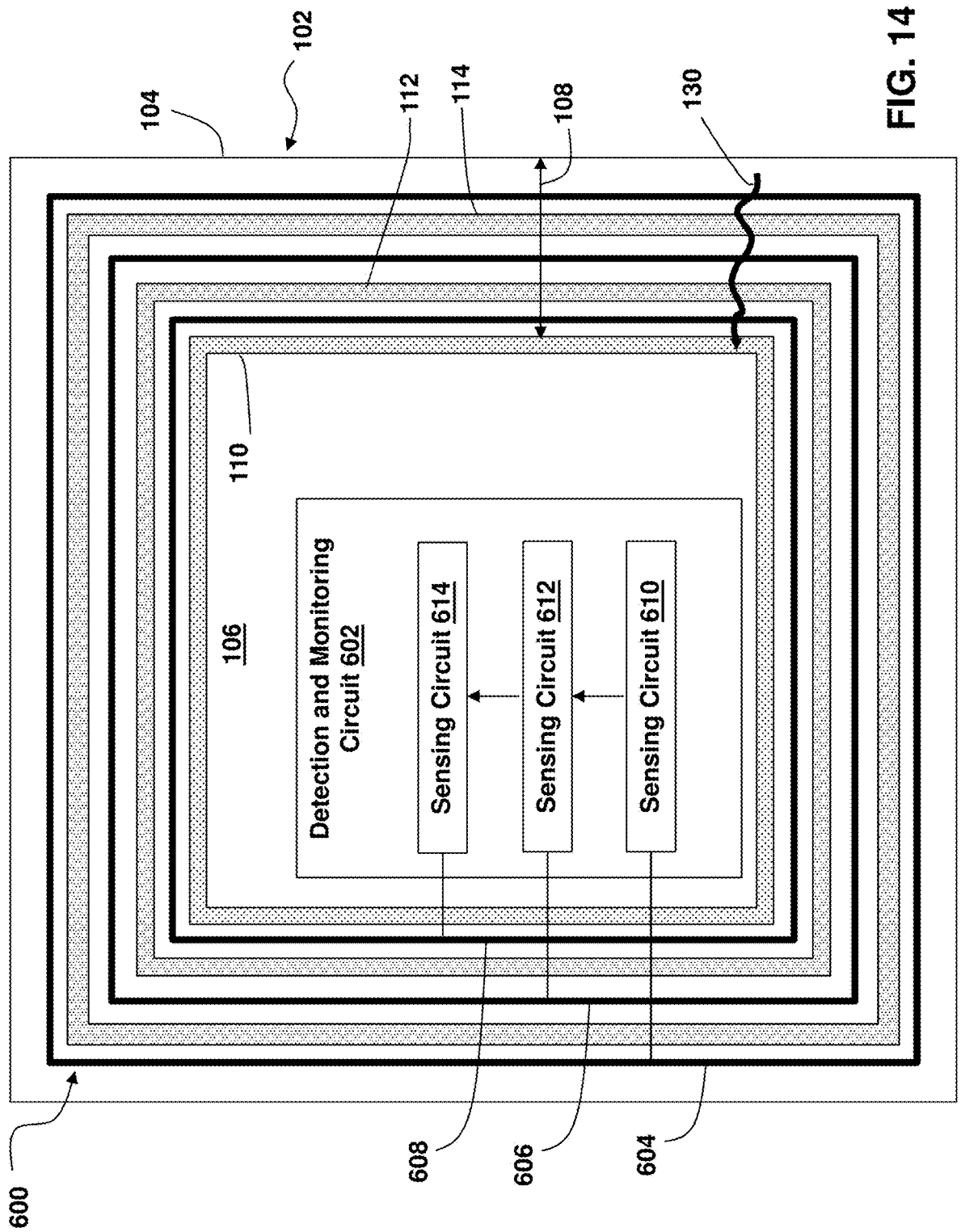
FIG. 14 depicts a plan view of an IC including a system for detecting and monitoring the growth of cracks according to embodiments.
Figure 15:
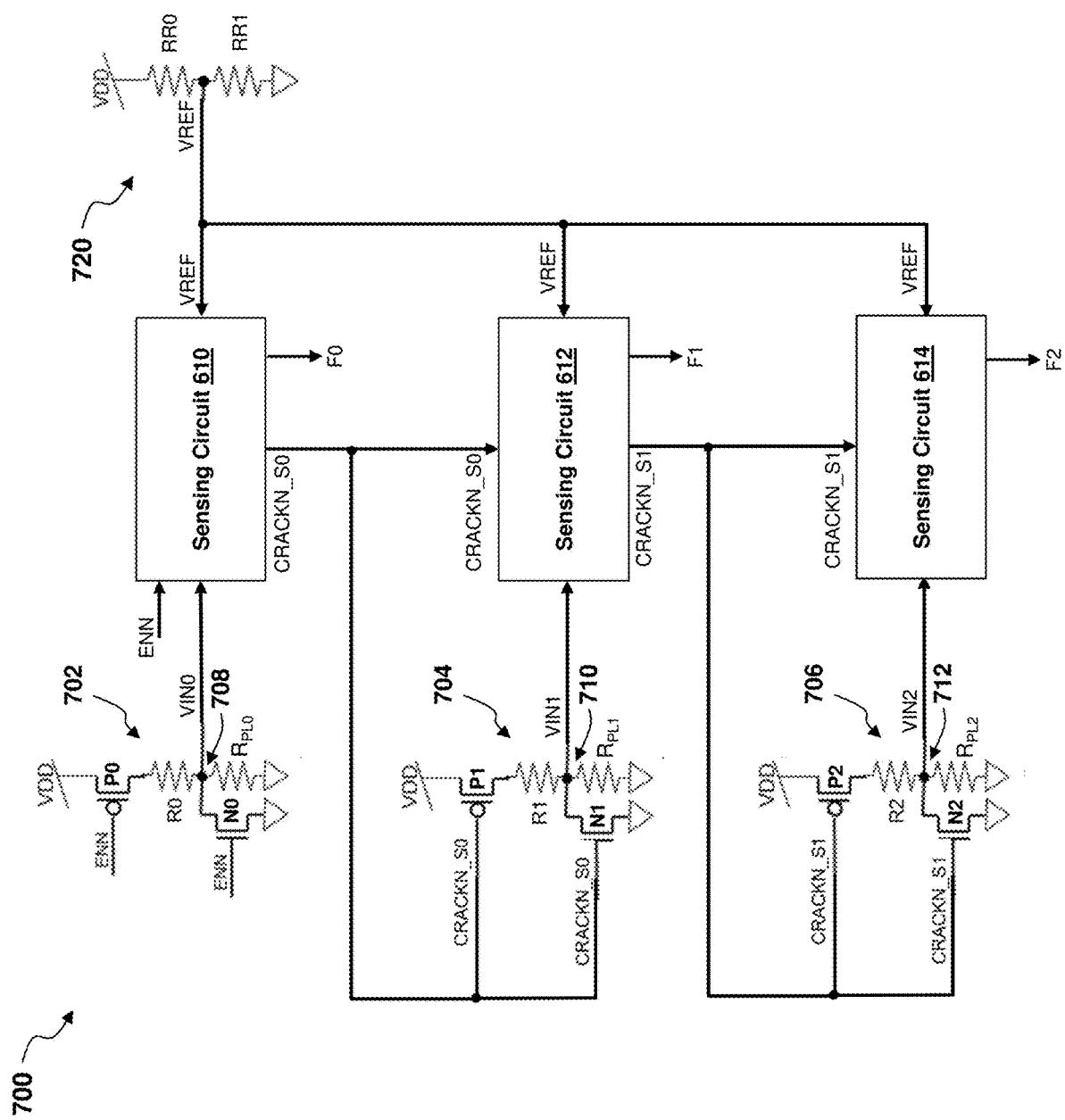
FIG. 15 depicts a circuit diagram of a detection and monitoring circuit including a cascaded arrangement of sensing circuits according to embodiments.

FIG. 14 depicts a detection and monitoring circuit 602 according to embodiments that may be used in a crack detecting and monitoring system 600 including a plurality of PLINES (e.g., PLINE 604, PLINE 606, PLINE 608), where PLINE 608 is located closer to the active region 106 of the IC 102 than PLINE 606, and where PLINE 606 is located closer to the active region 106 than PLINE 604. As shown in FIG. 14, the crack detecting and monitoring circuit 602 may include a plurality of N (N=3 in this example) of stages of cascaded sensing circuits. For example, the detection and monitoring circuit 602 may include a first stage sensing circuit 610 for sensing the resistance $R_{PL0}$ of PLINE 604, a second stage sensing circuit 612 for sensing the resistance $R_{PL1}$ of PLINE 606, and a third stage sensing circuit 614 for sensing the resistance $R_{PL2}$ of PLINE 608. The sensing circuits 610, 612, 614 may be arranged in series (e.g., cascaded) such that the sensing circuit 612 is only enabled after the sensing circuit 610 has detected a crack at PLINE 604. Likewise, the sensing circuit 614 is only enabled after the sensing circuit 612 has detected a crack at PLINE 606. FIG. 15, referred to concurrently with FIG. 14, depicts a circuit diagram 700 of the detection and monitoring circuit 602 including a cascaded arrangement of sensing circuits 610, 612, 614 according to embodiments.

In operation, the circuit 700 is configured to output a plurality of different flags indicating the presence and growth of a crack 130 towards the active region 106 of the IC 102. That is, each of the cascaded sensing circuits 610, 612, 614 is configured to set a corresponding flag as the crack 130 propagates closer to the active region 106 of the IC 102. Corresponding alerts may be provided to an end user of the IC 102 in response to the flags.

The first stage sensing circuit 610 receives an input voltage VIN0 generated by a first stage voltage divider 702. Similarly, the second stage sensing circuit 612 receives a input voltage VIN1 generated by a second stage voltage divider 704, while the third stage sensing circuit 614 receives a input voltage VIN2 generated by a third stage voltage divider 706.

The first stage voltage divider 702 is formed by a reference resistor R0 and a resistor $R_{PL0}$ that represents the resistance of PLINE 604. According to embodiments, PLINE 604 may have a resistance $R_{PL0}$ of about 10 k ohms when intact and greater than 1M ohms when damaged by a crack. The resistor R0 may have a resistance that is much greater than the resistance $R_{PL0}$ of PLINE 604 when intact. For example, resistor R0 may have a resistance of about 100 k ohms. VIN0 is the voltage at a node 708 of the voltage divider 702 between resistor R0 and resistor $R_{PL0}$.

The drain of an n-type field effect transistor (NFET) N0 is coupled to node 708. A source of NFET N0 is coupled to a ground voltage VSS (e.g., 0V). The drain of a p-type field effect transistor (PFET) P0 is coupled R0, with a source of PFET P0 coupled to a supply voltage VDD (e.g., 1V).

The first stage sensing circuit 610 may be selectively enabled by an enable signal ENN. In addition, the enable signal ENN is applied to the gates of NFET N0 and PFET P0 of the first stage voltage divider 702. When the enable signal ENN=1V (e.g., VDD), the first stage sensing circuit 610 is disabled, and no current (only nA leakage currents) is consumed by the first stage sensing circuit 610. In addition, when the enable signal ENN=1V, PFET P0 is turned off and NFET N0 is turned on, pulling the voltage VIN0 at node 708 to ground (e.g., VIN0=0V). To this extent, when ENN=1V, no power is consumed by the first stage sensing circuit 610 and no DC current flows through the first stage voltage divider 702.

Each sensing circuit 610, 612, 614 receives a reference voltage VREF. VREF may be provided by a voltage divider 720 formed of two resistors RR0 and RR1 as shown in FIG. 15, using a bandgap voltage reference circuit, or in any other suitable manner. Assuming that RR0=RR1, then the voltage divider 720 is configured to output a reference voltage VREF=VDD/2 (e.g., VREF=~0.5V).

When ENN=0, the first stage sensing circuit 602 is enabled, NFET N0 is turned off, and PFET P0 is turned on. The first stage sensing circuit 610, when enabled (e.g., ENN=0V), is configured to compare the voltages VIN0 and VREF and generate an enable signal CRACKN_S0 that is provided to the second stage voltage divider 704 and the second stage sensing circuit 612. The first stage sensing circuit 610 may also generate a flag F0 indicative of the state of PLINE 604.

When intact, PLINE 604 may have equivalent resistance $R_{PL0}$ of 10 k ohms. Hence, when ENN=0V (enabling the first stage sensing circuit 610), the first stage voltage divider 702 outputs a voltage VIN0 at node 708 of:

$$VDD*(R_{PL0}/(R_{PL0}+R0))=VDD*(10k/(10k+100k))$$
$$=\sim 0.009*VDD=\sim 0V.$$

In response, because VIN0 is less than the reference voltage VREF, the first stage sensing circuit 610 sets CRACKN_S0=1V, which disables the second stage sensing circuit 612, and sets F0=0V, indicating that PLINE 604 is intact.

If PLINE 604 has been damaged by a crack, its resistance $R_{PL0}$ may increase by several orders of magnitude (e.g., from 10 k ohms to >1M ohms). In this scenario, the first stage voltage divider 702 outputs a voltage VIN0 at node 708 of:

$$VDD*(R_{PL0}/(R_{PL0}+R0))=VDD*(1M/(1M+100k))$$
$$=\sim 0.9*VDD=\sim VDD.$$

In response, because VIN0 is now greater than the reference voltage VREF, the first stage sensing circuit 610 sets CRACKN_S0=0V, which enables the second stage sensing circuit 612, and sets F0=1V, indicating that PLINE 604 has been damaged. According to embodiments, the flag F0 is the inverse of the enable signal CRACKN_S0.

The second stage voltage divider 704 is formed by a reference resistor R1 and a resistor $R_{PL1}$ that represents the resistance of PLINE 606. The third stage voltage divider 706 similarly includes a reference resistor R2 and a resistor $R_{PL2}$ that represents the resistance of PLINE 608. PLINEs 606, 608 may have a resistance $R_{PL1}$, $R_{PL2}$, respectively, of about 10 k ohms when intact and greater than 1M ohms when damaged by a crack. The resistors R1, R2 may have a resistance of about 100 k ohms. VIN1 is the voltage at node 710 of the second stage voltage divider 704. VIN2 is the voltage at a node 712 of the third stage voltage divider 706.

In the second stage voltage divider 704, the drain and source of an NFET N1 are coupled to node 710 and ground, respectively. The drain and source of a PFET P1 are coupled to resistor R1 and VDD, respectively.

The second stage sensing circuit 612 may be selectively enabled by the enable signal CRACKN_S0 generated by the first stage sensing circuit 612. In addition, the enable signal CRACKN_S0 is applied to the gates of NFET N1 and PFET P1 of the second stage voltage divider 704. When the enable signal CRACKN_S0=1V (indicating that PLINE 604 is intact), the second stage sensing circuit 612 is disabled and consumes no current. In addition, when the enable signal CRACKN_S0=1V, PFET P1 is turned off and NFET N1 is turned on, pulling the voltage VIN1 at node 710 to ground (e.g., VIN1=0V).

When the enable signal CRACKN_S0=0V (indicating that PLINE 604 has been damaged), the second stage sensing circuit 612 is enabled, NFET N1 is turned off, and PFET P1 is turned on. The second stage sensing circuit 612, when enabled (e.g., CRACKN_0=0V), is configured to compare the voltages VIN1 and VREF and generate an enable signal CRACKN_S1 for the third stage sensing circuit 614. The second stage sensing circuit 612 may also generate a flag F1 (e.g., the inverse of CRACKN_S1) indicative of the state of PLINE 606.

When intact, PLINE 606 may have equivalent resistance $R_{PL1}$ of 10 k ohms. In this case, with CRACKN_S0=0V, the second stage voltage divider 704 outputs a voltage VIN1 at node 710 of:

$$VDD*(R_{PL1}/(R_{PL1}+R1))=VDD*(10k/(10k+100k))$$
$$=\sim 0.009*VDD=\sim 0V.$$

In response, because VIN1 is less than the reference voltage VREF, the second stage sensing circuit 612 sets CRACKN_S1=1V, which disables the third stage sensing circuit 614, and sets F1=0V, indicating that PLINE 606 is intact.

If PLINE 606 has been damaged by a crack, its resistance $R_{PL1}$ increases by several orders of magnitude (e.g., from 10 k ohms to >1M ohms). As a result, the second stage voltage divider 704 outputs a voltage VIN1 at node 710 of:

$$VDD*(R_{PL1}/(R_{PL1}+R1))=VDD*(1M/(1M+100k))$$
$$=\sim 0.9*VDD=\sim VDD.$$

In response, because VIN1 is now greater than the reference voltage VREF, the second stage sensing circuit 612 sets CRACKN_S1=0V, which enables the third stage sensing circuit 614, and sets F1=1V, indicating that PLINE 606 has been damaged.

In the third stage voltage divider 706, the drain and source of an NFET N2 are coupled to node 712 and ground, respectively. The drain and source of a PFET P2 are coupled to resistor R2 and VDD, respectively.

The third stage sensing circuit 614 may be selectively enabled by the enable signal CRACKN_S1 generated by the second stage sensing circuit 614. The enable signal CRACKN_S1 may also be applied to the gates of NFET N2 and PFET P2 of the third stage voltage divider 706. When the enable signal CRACKN_S1=1V (indicating that PLINE 606 is intact), the third stage sensing circuit 614 is disabled and consumes no current, PFET P2 is turned off, and NFET N2 is turned on, pulling the voltage VIN2 at node 712 to ground (e.g., VIN2=0V).

When the enable signal CRACKN_S1=0V (indicating that PLINE 606 has been damaged), the third stage sensing circuit 613 is enabled, NFET N2 is turned off, and PFET P2 is turned on. The third stage sensing circuit 614 compares the voltages VIN2 and VREF and generates an enable signal CRACKN_S2 and a flag F2 (e.g., the inverse of CRACKN_S2) indicative of the state of PLINE 608. Since the third stage sensing circuit 614 is the last of the cascaded sensing circuits in the described embodiment, the enable signal CRACKN_S2 is not used to enable a subsequent sensing circuit.

When intact, PLINE 608 may have equivalent resistance $R_{PL2}$ of 10 k ohms. In this case, with CRACKN_S1=0V, the third stage voltage divider 706 outputs a voltage VIN2 at node 712 of:

$$VDD*(R_{PL2}/(R_{PL2}+R2))=VDD*(10k/(10k+100k))$$
$$=~0.009*VDD=~0V.$$

Since VIN2 is less than the reference voltage VREF, the third stage sensing circuit 614 sets CRACKN_S2=1V and sets F2=0V, indicating that PLINE 608 is intact.

If PLINE 608 has been damaged by a crack, its resistance $R_{PL2}$ increases by several orders of magnitude (e.g., from 10 k ohms to >1M ohms). As a result, the third stage voltage divider 706 outputs a voltage VIN2 at node 712 of:

$$VDD(R_{PL2}/(R_{PL2}+R2))=VDD*(1M/(1M+100k))$$
$$=~0.9*VDD=~VDD.$$

In response, because VIN2 is now greater than the reference voltage VREF, the third stage sensing circuit 614 sets CRACKN_S2=0V, and sets F2=1V, indicating that PLINE 608 has been damaged.

Figure 16:
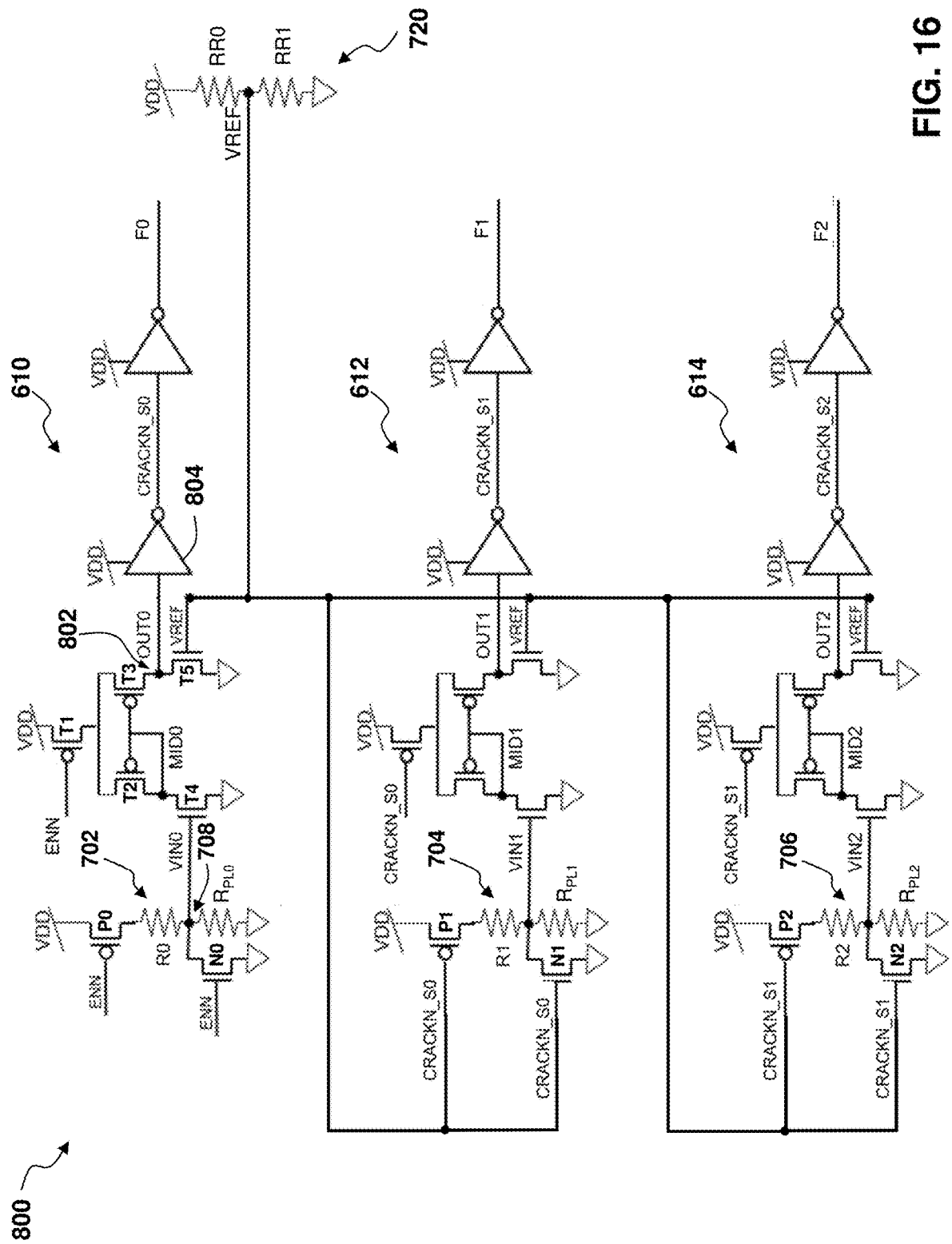
FIG. 16 depicts a circuit diagram of a detection and monitoring circuit including a cascaded arrangement of sensing circuits according to embodiments.

FIG. 16 depicts a more detailed circuit diagram 800 of the detection and monitoring circuit 602 including a cascaded arrangement of sensing circuits 610, 612, 614 according to embodiments. In the first stage sensing circuit6, as shown in FIG. 16, the enable signal ENN is coupled to the gate of a PFET T1. The source of PFET T1 is coupled to VDD and the drain of PFET T1 is coupled to the sources of a PFET T2 and a PFET T3.

The input voltage VIN0 at node 708 of the first stage voltage divider 702 is coupled to the gate of an NFET T4. The source of NFET T4 is coupled to ground, and the drain of NFET T4 is coupled to the drain of PFET T2 and the gates of PFETS T2 and T3. The drain of PFET T3 and the drain of NFET T5 are connected at a node 802. The gate of NFET T5 is coupled to the reference voltage VREF.

The enable signal ENN enables the sensing circuit 610 when ENN=0V, which turns on PFET T1. When ENN=1V (e.g., VDD), PFET T1 is turned off and the sensing circuit 610 is disabled. In addition, when ENN=1V, the reference voltage VREF, which has a value of ~VDD/2, turns on NFET T5 and pulls the voltage OUT0 at node 802 to ground (0V).

The voltage OUT0 at node 802 is passed through a first inverter 804 to produce the enable signal CRACKN_S1, which is passed to the second stage voltage divider 704 and the second stage sensing circuit 612. The enable signal CRACKN_S0 is also passed through a second inverter 806 to provide the flag F0. When ENN=1V, OUT0=0V, CRACKN_S0=1V, and F0=0V.

An enable signal ENN=0V enables both the first stage sensing circuit 610 and the first stage voltage divider 702, which outputs an input voltage VIN0 at node 708. NFET T4 is gated by the input voltage VIN0, which is ~0V or VDD based on the integrity (intact or broken, respectively) of PLINE 604. The sensing circuit 610 is configured to compare the current through NFET T5 due to the reference voltage VREF to the current through NFET T4 due to the input voltage VIN0. When ENN=0V and PLINE 604 is fully intact (no damage) then VIN0=0V, OUT0=0V, CRACKN_S0=1V, and F0=0V. When ENN=0V and PLINE 604 is damaged, then VIN0=~VDD (1V), CRACKN_S0=0V, and F0=1V. In this scenario, the enable signal CRACKN_S0=0V will enable the next (second) stage sensing circuit 612. The second and third stage sensing circuits 612, 614 operate similarly to the first stage sensing circuit 610 based on the value of their respective enable signals CRACKN_S0, CRACKN_S1.

The sensing circuit 610 does not consume current when PLINE 604 is intact (no damage). In this case, VIN0=~0V, which turns off NFET T4 and the MID0 voltage is floated. Since the reference voltage VREF=VDD/2 (or other reference voltage depending upon implementation), the voltage OUT0 is pulled safely to 0V and a known output is provided to subsequent circuits. The sensing circuit 604 only consumes current if PLINE 604 has been damaged (e.g., when ENN=0V and VIN0=1V).

Embodiments of the disclosure may provide several technical and commercial advantages, some of which here discussed herein by way of example. The crack detecting and monitoring systems disclosed herein are configured to detect the presence of a crack in an inactive region of an IC and to alert an end user of the presence of the crack and its growth progression towards the active region of the IC. In addition, the crack detecting and monitoring systems disclosed herein are designed to warn an end user of an impending catastrophic failure before it becomes an actual catastrophic failure where a crack propagates into the active region of the IC. This allows an end user to replace an IC before it fails due to crack propagation. The crack detecting and monitoring systems can be arranged and calibrated in a manner to provide an approximate time frame to imminent failure of an IC.

The crack detecting and monitoring systems disclosed herein may include straddling or tunneling connections to a detecting and monitoring circuit that circumvent and traverse crackstop(s) and/or guard rail(s) through either the top metal levels (BEOL) or via buried semiconductor wells in a semiconductor substrate of an IC. The crack detecting and monitoring systems disclosed herein may also include purposely designed weak points that that will guide crack growth to desired locations where a crack will be trapped and its energy dispersed.

The crack detecting and monitoring systems disclosed herein may include a multi-stage, serially connected (e.g., cascaded) arrangement of sensing circuits for monitoring structures (e.g., PLINES) on an IC. Advantageously, a sensing circuit for a stage N+1 is not enabled and does not consume power until the sensing circuit for an upsteam stage N has detected damage to its respective structure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The invention claimed is:

1. A crack detecting and monitoring system, comprising:
a plurality of electrically conductive structures extending about a protective barrier formed in an inactive region of an integrated circuit (IC), wherein an active region of the IC is enclosed within the protective barrier; and
a plurality of stages of sensing circuits connected in series for sensing a change in an electrical characteristic of each of the plurality of structures and for receiving an enable signal, wherein each sensing circuit is coupled to a respective structure of the plurality of structures, the change in the electrical characteristic indicating damage to the respective structure,
wherein each sensing circuit incudes a circuit for selectively generating the enable signal for a next sensing circuit in the plurality of stages of sensing circuits.

2. The system according to claim 1, wherein the plurality of structures comprise a plurality of electrically conductive perimeter lines (PLINEs), and wherein the change in the electrical characteristic indicates a presence of a crack in the structure.

3. The system according to claim 1, wherein the electrical characteristic comprises an electrical resistance of the structure.

4. The system according to claim 3, wherein the sensing circuit in each stage of the plurality of stages of sensing circuits further comprises:
a voltage divider circuit, coupled to the enable signal received by the sensing circuit, for outputting a voltage input signal VIN to the sensing circuit based on a damage status of the structure coupled to the sensing circuit.

5. The system according to claim 4, wherein the voltage divider circuit further comprises:
a first resistor representing an electrical resistance of the structure; and
a reference resistor coupled at an output node to the first resistor, the reference resistor having a electrical resistance greater than the electrical resistance of the structure when the structure is undamaged and less than the electrical resistance of the structure when the structure is damaged.

6. The system according to claim 5, wherein the voltage divider circuit further comprises:
a first field effect transistor (FET); and
a second FET;
wherein a first terminal of the first FET is coupled to the output node, a second terminal of the first FET is coupled to ground, a first terminal of the second FET is coupled to the reference resistor, and a second terminal of the second FET is coupled to a supply voltage, and
wherein a gate of the first FET, a gate of the second FET are coupled to the enable signal.

7. The system according to claim 4, wherein the circuit for selectively generating the enable signal for the next sensing circuit further comprises:
an input for receiving a reference voltage VREF;
an input for receiving the voltage input signal VIN from the voltage divider circuit;
a circuit for generating an output signal OUT based on the reference voltage VREF and the voltage input signal VIN; and
a circuit for generating the enable signal for the next sensing circuit based on the OUT signal.

8. The system according to claim 7, further comprising a circuit for outputting a flag indicating a damage status of the structure coupled to the sensing circuit.

9. A method for detecting and monitoring a crack in an integrated circuit (IC), comprising:
providing a plurality of electrically conductive structures in an inactive region of the IC, the plurality of electrically conductive structures extending about a protective barrier formed in the inactive region of the IC, wherein an active region of the IC is enclosed within the protective barrier;
coupling a plurality of stages of sensing circuits connected in series to the plurality of electrically conductive structures, wherein each sensing circuit is coupled to a respective structure of the plurality of structures;
enabling the sensing circuit in a stage N of the plurality of stages of sensing circuits;
monitoring, by the enabled sensing circuit, an electrical characteristic of the respective structure coupled to the enabled sensing circuit; and
in response to detecting a change in the electrical characteristic of the respective structure coupled to the enabled sensing circuit, outputting, by the enabled sensing circuit, an enable signal for enabling the sensing circuit in a downstream stage N+1 of the plurality of stages of sensing circuits.

10. The method according to claim 9, further comprising outputting a flag indicating the change in the electrical characteristic of the respective structure coupled to the enabled sensing circuit.

11. The method according to claim 10, further comprising providing an alert in response to the flag, the alert indicating that the respective structure coupled to the enabled sensing circuit has been damaged.

12. The method according to claim 10, wherein the change in the electrical characteristic of the respective structure coupled to the enabled sensing circuit is due to a crack propagating through the inactive region of the IC, the method further comprising providing the alert before the crack has propagated from the inactive area of the IC into the active region of the IC.

13. The method according to claim 9, further comprising positioning the structure coupled to the stage N of the plurality of stages of sensing circuits closer to the active region of the IC than the structure coupled to the stage N+1 of the plurality of stages of sensing circuits.

14. A method, comprising:
coupling a plurality of stages of sensing circuits connected in series to a plurality of electrically conductive structures on an integrated circuit (IC), wherein each sensing circuit is coupled to a respective structure of the plurality of structures;
enabling the sensing circuit in a stage N of the plurality of stages of sensing circuits;
monitoring, by the enabled sensing circuit, an electrical characteristic of the respective structure coupled to the enabled sensing circuit; and
in response to detecting a change in the electrical characteristic of the respective structure coupled to the enabled sensing circuit, outputting, by the enabled sensing circuit, an enable signal for enabling the sensing circuit in a downstream stage N+1 of the plurality of stages of sensing circuits.

15. The method according to claim 14, further comprising generating an alert indicating damage to the respective structure coupled to the enabled sensing circuit.

16. The method according to claim 15, further comprising:
monitoring a propagation of a crack through the IC based on the alert.

17. The method according to claim 14, wherein the electrical characteristic comprises a resistance of the respective structure coupled to the enabled sensing circuit.

18. The method according to claim 14, wherein the plurality of electrically conductive structures comprise electrically conductive perimeter lines (PLINEs) in an inactive region of the IC, and wherein the change in the electrical characteristic indicates a presence of a crack in a PLINE.

\* \* \* \* \*